US011031952B2

(12) United States Patent
Kim

(10) Patent No.: US 11,031,952 B2
(45) Date of Patent: Jun. 8, 2021

(54) ERROR CORRECTION DECODER AND MEMORY SYSTEM HAVING THE SAME

(71) Applicant: SK hynix Inc., Icheon-si (KR)

(72) Inventor: Dae Sung Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 24 days.

(21) Appl. No.: 16/694,929

(22) Filed: Nov. 25, 2019

(65) Prior Publication Data

US 2020/0389186 A1 Dec. 10, 2020

(30) Foreign Application Priority Data

Jun. 4, 2019 (KR) .................. 10-2019-0066227

(51) Int. Cl.
*H03M 13/11* (2006.01)
*G06F 11/07* (2006.01)

(52) U.S. Cl.
CPC ....... *H03M 13/1108* (2013.01); *G06F 11/076* (2013.01); *H03M 13/1117* (2013.01); *H03M 13/1171* (2013.01); *H03M 13/1174* (2013.01)

(58) Field of Classification Search
CPC ......... H03M 13/1108; H03M 13/1171; H03M 13/1117; H03M 13/1134; H03M 13/1174; G06F 11/076
See application file for complete search history.

(56) References Cited

U.S. PATENT DOCUMENTS

| 2016/0087653 A1* | 3/2016 | Yang ................. G11B 20/1833 714/752 |
| 2019/0312593 A1* | 10/2019 | Hsiao ................. G06F 11/1068 |
| 2020/0177203 A1* | 6/2020 | Marchand .......... H03M 13/1131 |
| 2020/0313695 A1* | 10/2020 | Namboodiri ...... H03M 13/3927 |

FOREIGN PATENT DOCUMENTS

KR     10-2020-0019046 A     2/2020

OTHER PUBLICATIONS

Meng et al."Sum of the Magnitude for Hard Decision Decoding Algorithm Based on Loop Update Detection." Sensors, pp. 1-6, Jan. 15, 2018 (Year: 2018).*

* cited by examiner

*Primary Examiner* — Guy J Lamarre
(74) *Attorney, Agent, or Firm* — Perkins Coie LLP

(57) ABSTRACT

Provided herein may be an error correction decoder based on an iterative decoding scheme using NB-LDPC codes and a memory system having the same. The error correction decoder may include a symbol generator for assigning an initial symbol to a variable node, a reliability value manager for setting and updating reliability values of candidate symbols of the variable node in current iteration, a flipping function value calculator for calculating a flipping function value by subtracting a function value, related to the updated reliability values of remaining candidate symbols other than a target candidate symbol, from another function value, related to the updated reliability value of the target candidate symbol, in the current iteration, and a symbol corrector for changing the hard decision value to the target candidate symbol when the flipping function value is equal to or greater than a first threshold value in the current iteration.

20 Claims, 21 Drawing Sheets

$$H = \begin{bmatrix} \alpha & 0 & 0 & \alpha & \cdots & 0 \\ 0 & \alpha^2 & 0 & 1 & \cdots & \alpha \\ \vdots & \vdots & \vdots & \vdots & & \vdots \\ \alpha & 0 & \alpha^2 & 0 & \cdots & 1 \end{bmatrix} \Bigg\} n-k$$

$\underbrace{\phantom{xxxxxxxxxxxxxxxxxxxxx}}_{n}$ $$\begin{bmatrix} \alpha & 0 & 0 & \alpha & \cdots & 0 \\ 0 & \alpha^2 & 0 & 1 & \cdots & \alpha \\ \vdots & \vdots & \vdots & \vdots & & \vdots \\ \alpha & 0 & \alpha^2 & 0 & \cdots & 1 \end{bmatrix} \times \begin{bmatrix} C_{i1} \\ C_{i2} \\ C_{i3} \\ \vdots \\ C_{in} \end{bmatrix} = \begin{bmatrix} S_{i1} \\ S_{i2} \\ \vdots \\ S_{in-k} \end{bmatrix}$$

$\quad\quad H \quad\quad\quad\quad\quad\quad C_i^T \quad\quad S_i$

ERROR CORRECTION DECODER AND MEMORY SYSTEM HAVING THE SAME

CROSS-REFERENCE TO RELATED APPLICATION

This patent document claims priority to and benefits of the Korean patent application number 10-2019-0066227, filed on Jun. 4, 2019, which is incorporated herein by reference in its entirety.

TECHNICAL FIELD

Various embodiments of the disclosed technology generally relate to an error correction decoder using a decoding scheme, for example, non-binary low-density parity check (NB-LDPC) codes, and a memory system having the error correction decoder.

BACKGROUND

A memory system may include a storage medium configured to temporarily or permanently store data therein. During any of various operations, such as writing, reading, transmission, or processing, a data error or data corruption may occur.

In order to ensure the reliability of data, the memory system may use error correction techniques such as error correction encoding and error correction decoding.

SUMMARY

Various embodiments of the disclosed technology relates to an error correction decoder using NB-LDPC codes and a memory system having the error correction decoder. The disclosed technology provides an improved error correction capability when error correction decoding using NB-LDPC codes is performed, and a memory system having the error correction decoder.

In one aspect, an error correction decoder is provided. The error correction decoder may include a symbol generator configured to form the initial symbol and assign the initial symbol to a variable node, a reliability value manager configured to set the reliability values of candidate symbols corresponding to the variable node based on the initial symbol at the time of a start of a current iteration and update the reliability values of the candidate symbols based on check-to-variable (C2V) messages received by the variable node in current iteration, a flipping function value calculator configured to calculate a flipping function value by subtracting a second function value from a first function value in the current iteration, the first function value being related to the updated reliability value of a target candidate symbol, and the second function value being related to one or more of updated reliability values of remaining candidate symbols other than the target candidate symbol, and a symbol corrector configured to compare the flipping function value with a first threshold value in the current iteration and change a hard decision value of the variable node to the target candidate symbol upon a determination that the flipping function value is equal to or greater than the first threshold value.

In another aspect, a memory system is provided. The memory system may include a memory device, and a memory controller in communication with the memory device and including an error correction decoder configured to perform an error correction decoding using non-binary low-density parity check (NB-LDPC) codes based on a read vector received from the memory device. The error correction decoder may include a symbol generator configured to form the initial symbol by grouping read values included in the read vector and assign the initial symbol to a variable node, a reliability value manager configured to set the reliability values of candidate symbols corresponding to the variable node based on the initial symbol at the time of a start of a current iteration and update the reliability values of the candidate symbols based on check-to-variable (C2V) messages received by the variable node in the current iteration, a flipping function value calculator configured to calculate a flipping function value by subtracting a second function value from a first function value in the current iteration, the first function value being related to the updated reliability value of a target candidate symbol, and the second function value being related to one or more of updated reliability values of remaining candidate symbols other than the target candidate symbol from the candidate symbols, and a symbol corrector configured to compare the flipping function value with a first threshold value in the current iteration and change a hard decision value of the variable node to the target candidate symbol upon a determination that the flipping function value is equal to or greater than the first threshold value.

DETAILED DESCRIPTION

The specific structural or functional description disclosed herein is merely illustrative for the purpose of describing embodiments. The disclosed technology can be implemented in various forms, and cannot be construed as limited to the embodiments set forth herein.

The error correction scheme using Low-density parity check (LDPC) codes are widely used for error correction in a memory system, a communication system, and others because the LDPC codes can improve an error correction performance without increasing the computational complexity per bit even when the length of code is increased.

There are some considerations when implementing LDPC codes with regard to the reiteration. For example, when an error occurs in LDPC codes, a large number of iterations may be required until error correction decoding succeeds, which causes inefficiency and may result in a decoding failure. The disclosed technology provides techniques for addressing the inefficiency associated with the iterations and improving the error correction capability.

Figure 1:
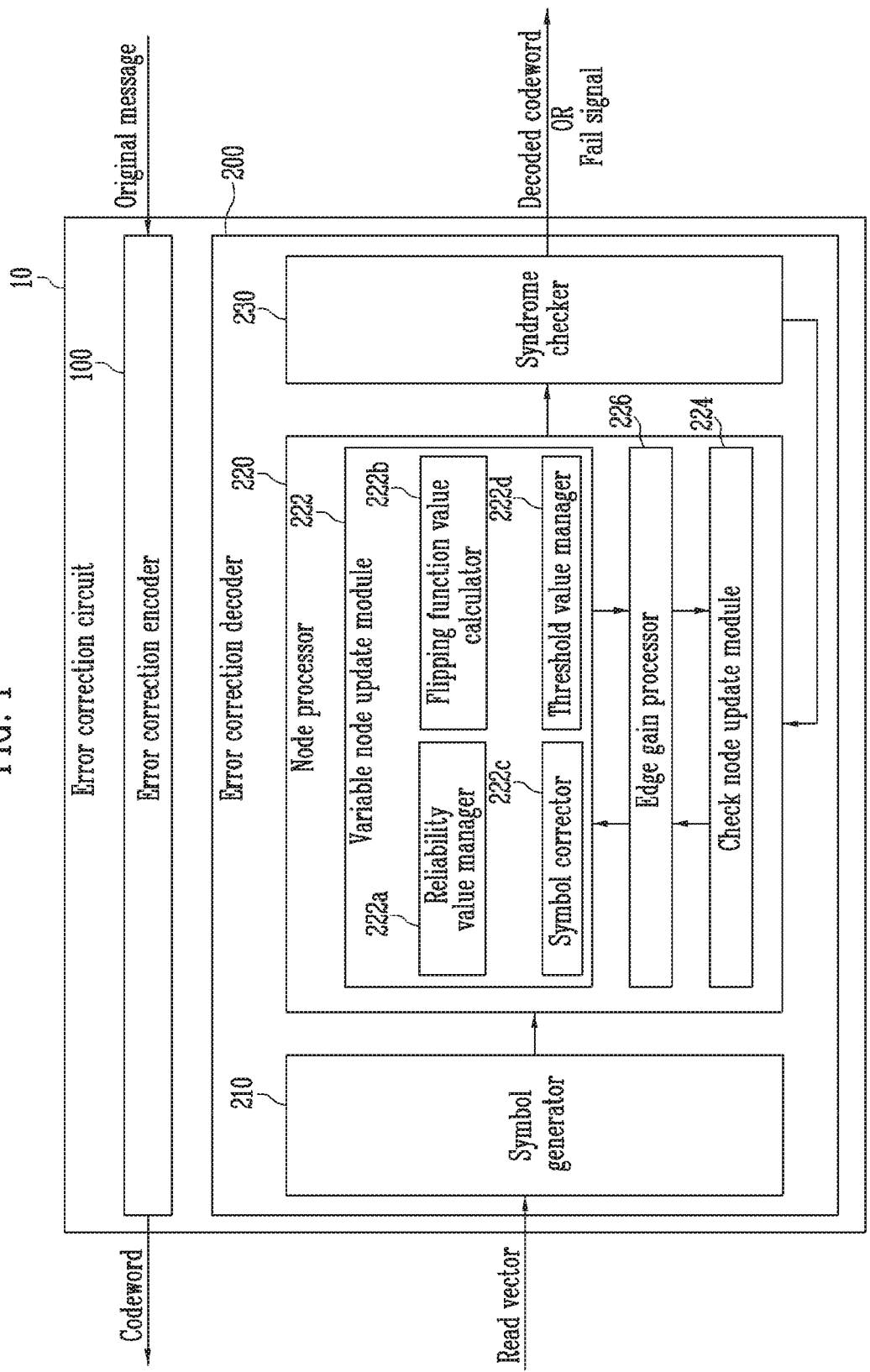
FIG. 1 is a diagram illustrating an error correction circuit based on some implementations of the disclosed technology.

FIG. 1 is a diagram illustrating an error correction circuit according to an embodiment of the disclosed technology.

Referring to FIG. 1, the error correction circuit 10 may include an error correction encoder 100 and an error correction decoder 200.

The error correction encoder 100 receives an original message, for which error correction encoding is to be performed, and may perform error correction encoding using the received original message and the generator matrix of an error correction code (ECC) or using the received original message and the parity check matrix of the error correction code. The error correction encoder 100 may output a codeword, generated as the result of performing error correction encoding, to a channel. When the error correction circuit 10 is applied in a memory system, the codeword may be stored in a plurality of memory cells (e.g., the memory cells forming a single page) included in a memory device.

The error correction encoder 100 may be a non-binary low-density parity check (NB-LDPC) encoder that uses LDPC codes, particularly NB-LDPC codes, as error correction codes, but embodiments of the present disclosure are not limited thereto.

The error correction decoder 200 may receive a read vector, which corresponds to the codeword, from the channel, and may perform error correction decoding for the received read vector.

The error correction decoder 200 may perform error correction decoding using any of various algorithms that employ an iterative decoding scheme. The error correction decoder 200 may perform error correction decoding using a message passing algorithm (MPA), which is referred to as a belief propagation algorithm (BPA). As the message passing algorithm, a bit flipping algorithm, a symbol flipping algorithm, a min-sum algorithm, a sum-product algorithm, or the like may be used. Hereinafter, embodiments of the present disclosure are described on the assumption that a symbol flipping algorithm is used, but the embodiments of the present disclosure are not limited thereto.

The error correction decoder 200 may perform error correction decoding before the number of iterations that are performed reaches a preset maximum number of iterations (I). Here, the maximum number of iterations (I) may be a nature number. When a valid codeword that satisfies the constraints of the parity check matrix of an error correction code is generated before the number of iterations reaches the maximum number of iterations (I), the error correction decoder 200 may output the generated valid codeword as a decoded codeword. When a valid codeword that satisfies the constraints of the parity check matrix of the error correction code is not generated until the number of iterations reaches the maximum number of iterations (I), the error correction decoder 200 may output a fail signal, which indicates that error correction decoding has failed.

The error correction decoder 200 may be an NB-LDPC decoder that uses LDPC codes, for example, NB-LDPC codes, as error correction codes, but embodiments of the disclosed technology are not limited thereto.

The error correction decoder 200 may include a symbol generator 210, a node processor 220, and a syndrome checker 230.

The symbol generator 210 may receive the read vector, which corresponds to the codeword, from the channel. The symbol generator 210 may configure the initial symbols to be assigned to variable nodes by grouping read values included in the read vector and provide the initial symbols to the node processor 220. For example, when the read vector includes 14 read values, the symbol generator 210 may form seven initial symbols, each having two read values. Each of the read values included in the read vector may be '0' or '1'

The node processor 220 may perform error correction decoding using a message passing algorithm based on the initial symbols received from the symbol generator 210. When error correction decoding is performed based on the message passing algorithm, a result converging to the codeword may be generated through the exchange of messages between the variable nodes and check nodes. The messages may include a variable-to-check (V2C) message, which is transmitted from a variable node to a check node, and a check-to-variable (C2V) message, which is transmitted from the check node to the variable node.

The node processor 220 may perform at least one iteration before the number of iterations reaches the maximum number of iterations (I). The node processor 220 may generate a hard decision vector corresponding to the i-th iteration, and may provide the generated hard decision vector to the syndrome checker 230. Here, T is a natural number that is equal to or less than the maximum number of iterations (I). The hard decision vector may include the hard decision values of the variable nodes. At least one of the hard decision values provided to the syndrome checker 230 may be modified based on at least one of a reliability value or an unreliability value, which will be described later.

The node processor 220 may include a variable node update module 222, a check node update module 224, and an edge gain processor 226.

Hereinafter, an example in which the node processor 220 operates based on a flooding scheme is described, but embodiments of the disclosed technology are not limited thereto. For example, the node processor 220 may operate based on a column-layered scheme or a row-layered scheme.

The variable node update module 222 may initialize the variable nodes using the initial symbols received from the symbol generator 210 before the first iteration is performed. That is, the variable node update module 222 may assign each of the initial symbols to each of the variable nodes as the hard decision value of the variable node.

In the first iteration, the variable node update module 222 may generate V2C messages in order to transmit the hard decision values of the variable nodes to the check nodes, and may transmit the generated V2C messages to the check node update module 224. The variable node update module 222 may update the hard decision value of each of the variable nodes based on the C2V messages received from the check node update module 224.

In each of the iterations excluding the first iteration, the variable node update module 222 may generate V2C messages based on the C2V messages received from the check node update module 224 and transmit the generated V2C messages to the check node update module 224. Also, the variable node update module 222 may update the hard decision values of the variable nodes based on the C2V messages received from the check node update module 224.

In each iteration, the check node update module 224 may update the values of the check nodes based on the V2C messages received from the variable node update module 222. Also, the check node update module 224 may generate C2V messages based on the V2C messages received from the variable node update module 222 and transmit the generated C2V messages to the variable node update module 222.

For the messages exchanged between the variable node update module 222 and the check node update module 224, edge gain processing or inverse edge gain processing may be performed. The edge gain processor 226 may perform edge gain processing for the V2C messages generated in the variable node update module 222 and transmit the V2C messages for which edge gain processing is performed to the check node update module 224. The edge gain processor 226 may perform inverse edge gain processing for the C2V messages generated in the check node update module 224 and transmit the C2V messages for which inverse edge gain processing is performed to the variable node update module 222. The edge gain may be acquired from the parity check matrix, and may be referred to as an edge coefficient or an edge weight.

The variable node update module 222 may include a reliability value manager 222A, a flipping function value calculator 222B, a symbol corrector 222C, and a threshold value manager 222D.

The reliability value manager 222A may manage the reliability values of candidate symbols corresponding to each of the variable nodes. The reliability values of the candidate symbols may become criteria for determining whether to modify the hard decision value of the variable node.

The reliability value manager 222A may set the reliability values of the candidate symbols for each of the variable nodes when each iteration starts. The candidate symbols are symbols that can be selected as the hard decision value of the variable node, and may include all of the symbols included in a Galois Field GF(q).

The reliability value manager 222A may set the reliability values of the candidate symbols in consideration of at least one of the initial symbol assigned to the variable node, the number of the iteration, or the number of unsatisfied check nodes (UCNs).

In an embodiment, the reliability value manager 222A may set the reliability values of the candidate symbols in consideration of the hamming distances between candidate symbols corresponding to the variable node and the initial symbol assigned to the variable node. The reliability value manager 222A may set the reliability values of the candidate symbols so as to be different from each other when the hamming distances from the initial symbol to the candidate symbols are different from each other. The reliability value manger 222A may set the reliability value of the candidate symbol to a higher value as the hamming distance from the initial symbol to the candidate symbol is smaller.

For example, if a GF(4) is used, candidate symbols corresponding to a variable node may be '00', '01', '10' and '11'. Here, '00', '01', '10' and '11' are the binary representation of GF(4) symbols 0, 1, $\alpha$ and $\alpha^2$. If the initial symbol assigned to the variable node is '01', the reliability value of the candidate symbol '01', which has the smallest hamming distance (0) from the initial symbol '01', may be set to 3, the reliability value of each of the candidate symbols '00' and '11', which has the second smallest hamming distance (1) from the initial symbol '01', may be set to 1, and the reliability of the candidate symbol '10', which has the largest hamming distance (2) from the initial symbol '01', may be set to 0.

In an embodiment, the reliability value manager 222A may set the reliability values of the candidate symbols in consideration of the number of the iteration. The reliability value manager 222A may set the reliability value of at least one of the candidate symbols to a lower value than that in the previous iteration. In an embodiment, the reliability value manager 222A may set the reliability value of at least one of the candidate symbols to a higher value than that in the previous iteration.

In an embodiment, the reliability value manager 222A may set the reliability values of the candidate symbols in consideration of the number of the iteration and the hamming distances between each of the candidate symbols and the initial symbol. The reliability value manager 222A may set the reliability value of the candidate symbol having a smaller hamming distance from the initial symbol to a lower value as the number of the iteration increases. In an embodiment, the reliability value manager 222A may set the reliability value of the candidate symbol having a smaller hamming distance from the initial symbol to a higher value as the number of the iteration increases.

For example, assume that a GF(4) is used and that the initial symbol assigned to a variable node is '01'. Also, assume that, in the i-th iteration, the reliability value of the candidate symbol '01' is set to 3, the reliability value of each of the candidate symbols '00' and '11' is set to 1, and the reliability value of the candidate symbol '10' is set to 0. In this case, the reliability value of the candidate symbol '01', which has the smallest hamming distance from the initial symbol '01', may be set to 2 in the (i+1)-th iteration. The reliability value of each of the remaining candidate symbols '00', '10' and '11' may be set to the same value as that in the i-th iteration, or may be set to a higher value than that in the i-th iteration.

In an embodiment, the reliability value manager 222A may set the reliability values of the candidate symbols in consideration of the number of UCNs. As the number of UCNs coupled to the variable node in the i-th iteration is greater, the reliability value manager 222A may set the reliability value of at least one of the candidate symbols corresponding to the variable node to a lower value in the (i+1)-th iteration than that in the i-th iteration. In an embodiment, as the number of UCNs coupled to the variable node in the i-th iteration is greater, the reliability value manager 222A may set the reliability value of at least one of the candidate symbols corresponding to the variable node to a higher value in the (i+1)-th iteration than that in the i-th iteration.

In an embodiment, the reliability value manager 222A may set the reliability values of the candidate symbols in consideration of the number of UCNs and the hamming distance. For example, as the number of UCNs coupled to the variable node in the i-th iteration is greater, the reliability value manager 222A may set the reliability value of the candidate symbol having a smaller hamming distance from the initial symbol to a lower value in the (i+1)-th iteration than that in the i-th iteration. In an embodiment, as the number of UCNs coupled to the variable node in the i-th iteration is greater, the reliability value manager 222A may set the reliability value of the candidate symbol having a smaller hamming distance from the initial symbol to a higher value in the (i+1)-th iteration than that in the i-th iteration.

For example, assume that a GF(4) is used and that the initial symbol assigned to a variable node is '01'. Also, assume that, in the i-th iteration, the reliability value of the candidate symbol '01' is set to 3, the reliability value of each of the candidate symbols '00' and '11' is set to 1, and the reliability value of the candidate symbol '10' is set to 0. In this case, when the number of UCNs coupled to the variable node is 20 in the i-th iteration, the reliability value of the candidate symbol '01', which has the smallest hamming distance from the initial symbol '01', may be set to 2 in the (i+1)-th iteration, and when the number of UCNs coupled to the variable node is 30 in the i-th iteration, the reliability value of the candidate symbol '01' may be set to 1 in the (i+1)-th iteration. The reliability value of each of the remaining candidate symbols '00', '10' and '11' may be set to the same value as that in the i-th iteration, or may be set to a higher value than that in the i-th iteration.

The reliability value manager 222A may update the reliability values of the candidate symbols based on the C2V messages received by the variable node in each iteration. For example, the reliability value manager 222A may increase the reliability value of the candidate symbol by the number of C2V messages representing the candidate symbol. For example, the reliability value manager 222A may increase the reliability value of the candidate symbol '10' by 1 when one C2V message representing the candidate symbol '10' is received, and may increase the reliability value of the candidate symbol '10' by 2 when two C2V messages representing the candidate symbol '10' are received.

In each iteration, the reliability value manager 222A may provide the updated reliability values of the candidate symbols of each of the variable nodes to the flipping function value calculator 222B.

In each iteration, the flipping function value calculator 222B may receive the updated reliability values of the candidate symbols of each of the variable nodes from the reliability value manager 222A and calculate a flipping function value corresponding to each of the variable nodes based on the received updated reliability values.

The flipping function value calculator 222B may calculate a first function value and a second function value and calculate a flipping function value by subtracting the second function value from the first function value. Here, the first function value may be a value related to the updated reliability value of a target candidate symbol among the candidate symbols, and the second function value may be a value related to one or more of updated reliability values of remaining candidate symbols other than the target candidate symbol.

The flipping function value calculator 222B may select the target candidate symbol among the candidate symbols in order to calculate the first function value and the second function value. The target candidate symbol may be selected for each of the variable nodes.

In an embodiment, the flipping function value calculator 222B may select the candidate symbol corresponding to the largest value, among the updated reliability values of the candidate symbols, as the target candidate symbol. The flipping function value calculator 222B may compare the updated reliability values of all of the candidate symbols with each other in order to select the target candidate symbol.

In an embodiment, the flipping function value calculator 222B may select the candidate symbol corresponding to the largest value, among the updated reliability values remaining after excluding the updated reliability value of the candidate symbol that is the same as the hard decision value of the variable node from the updated reliability values of the candidate symbols, as the target candidate symbol. The flipping function value calculator 222B may compare the updated reliability values of the remaining candidate symbols other than the candidate symbol that is the same as the hard decision value of the variable node, with each other in order to select the target candidate symbol. In this case, if the updated reliability values are compared with each other in a tournament manner, the number of comparisons may decrease by 1 compared to that in the above-described embodiment.

When the target candidate symbol is selected, the flipping function value calculator 222B may calculate the first function value and the second function value based on a preset method. The first function value and the second function value may be calculated for each of the variable nodes.

In an embodiment, the first function value may be the updated reliability value of the target candidate symbol.

In an embodiment, the first function value may be the updated reliability value of the target candidate symbol to which at least one of a scaling factor or a scaling offset is applied. The scaling factor may be a value by which the updated reliability value of the target candidate symbol is multiplied, and the scaling offset may be a value that is added to the updated reliability value of the target candidate symbol. The scaling factor and the scaling offset may be constants or variables. At least one of the scaling factor or the scaling offset may be set based on at least one of the degree of the variable node or the number of the iteration. For example, at least one of the scaling factor or the scaling offset may be set larger as the degree of the variable node is larger or as the number of the iteration increases.

In an embodiment, the second function value may be the second largest value among the updated reliability values of the candidate symbols.

In an embodiment, the second function value may be a value calculated by adding at least two of the updated reliability values remaining after excluding the largest value from the updated reliability values of the candidate symbols. For example, the second function value may be a value calculated by adding the second largest value and the third largest value, among the updated reliability values of the candidate symbols. For example, the second function value may be a value calculated by adding all of the values remaining after excluding the largest value from the updated reliability values of the candidate symbols.

In an embodiment, the second function value may be the updated reliability value of the candidate symbol that is the same as the hard decision value of the variable node.

When the first function value and the second function value are calculated, the flipping function value calculator 222B may calculate a flipping function value by subtracting the second function value from the first function value. The flipping function value calculator 222B may provide the calculated flipping function value to the symbol corrector 222C. The flipping function value may be calculated and provided for each of the variable nodes. Here, the flipping function value calculator 222B may further provide information about the target candidate symbol to the symbol corrector 222C.

The symbol corrector 222C may modify or maintain the hard decision values of the variable nodes based on the flipping function values received from the flipping function value calculator 222B.

The symbol corrector 222C may determine whether the flipping function value is equal to or greater than a first threshold value by comparing the flipping function value with the first threshold value for each of the variable nodes. The first threshold value may be a positive number. When the flipping function value is equal to or greater than the first threshold value, this may indicate that the target candidate symbol is a more accurate estimate for the variable node. Therefore, the symbol corrector 222C may change the hard decision value of the variable node to the target candidate symbol when the flipping function value is equal to or greater than the first threshold value. In some implementations, the symbol corrector 222C may set the unreliability value of the variable node to an initial value, which will be described later. The symbol corrector 222C may not change the hard decision value of the variable node when the flipping function value is less than the first threshold value.

In an embodiment, the symbol corrector 222C may skip the comparison with the first threshold value when the flipping function value corresponding to the variable node is not a positive number.

In an embodiment that the flipping function value corresponding to the variable node is not a positive number, the symbol corrector 222C may determine whether the absolute value of the flipping function value is equal to or greater than the first threshold value by comparing the absolute value of the flipping function value with the first threshold value. For example, when the first function value is related to the largest value among the remaining updated reliability values other than the updated reliability value of the candidate symbol that is the same as the hard decision value of the variable node, and when the second function value is related to the updated reliability value of the candidate symbol that is the same as the hard decision value of the variable node, if the flipping function value is not a positive number and the absolute number thereof is equal to or greater than the first threshold value, this may indicate that the hard decision value of the variable node is a more accurate estimate. Therefore, the symbol corrector 222C does not change the hard decision value of the variable node, and may set the unreliability value of the variable node to an initial value, which will be described later.

Meanwhile, in order to ensure the reliability of the variable nodes, for which symbol correction is not performed because the flipping function value is less than the first threshold value, additional information may be used. This information is referred to as the unreliability value of the variable node in embodiments of the disclosed technology.

The symbol corrector 222C may manage the unreliability values of the respective variable nodes. The symbol corrector 222C may set the unreliability values of the respective variable nodes to initial values when the first iteration starts. For example, the symbol corrector 222C may set the unreliability values of the respective variable nodes to the same initial value, for example, 0, when the first iteration starts. The symbol corrector 222C may update the unreliability value of a variable node depending on whether the flipping function value calculated for the variable node in an iteration is equal to or greater than a predetermined threshold value.

In order to represent the unreliability value, one bit or two or more bits may be allocated to each of the variable nodes, and the two respective cases are described hereinafter.

First, the case in which one bit is allocated in order to represent an unreliability value is described.

The symbol corrector 222C may determine whether the flipping function value is equal to or greater than a second threshold value, which is less than the first threshold value, for each of the variable nodes in which the flipping function value is less than the first threshold value. The second threshold value may be a positive number. When the flipping function value corresponding to the variable node is equal to or greater than the second threshold value and less than the first threshold value, the symbol corrector 222C may check whether the unreliability value of the corresponding variable node is changed from an initial value. For example, the symbol corrector 222C may check whether the bit allocated for representing the unreliability value is changed to 1 from the initial value 0.

When the unreliability value is not changed in the variable node, of which the flipping function value is equal to or greater than the second threshold value and less than the first threshold value, the symbol corrector 222C may change the unreliability value of the corresponding variable node. For example, the symbol corrector 222C may change the unreliability value of the corresponding variable node to 1 from the initial value 0. The unreliability value may be regarded as representing the possibility that the current hard decision value of the variable node is an error.

When the unreliability value is changed from the initial value in the variable node, of which the flipping function value is equal to or greater than the second threshold value and less than the first threshold value, the symbol corrector 222C may change the hard decision value of the corresponding variable node. For example, the symbol corrector 222C may change the hard decision value of the variable node, in which the unreliability value is changed from the initial value, to the target candidate symbol corresponding to the current iteration. In an embodiment, when it changes the hard decision value of the variable node based on the unreliability value, the symbol corrector 222C may set the unreliability value of the corresponding variable node to the initial value. In an embodiment, even though it changes the hard decision value of the variable node based on the unreliability value, the symbol corrector 222C may not change the unreliability value of the corresponding variable node. This is because, when the flipping function value is equal to or greater than the second threshold value and less than the first threshold value, the target candidate symbol may be a less accurate estimate for the variable node than when the flipping function value is equal to or greater than the first threshold value. Therefore, in this case, the unreliability value of the variable node may not be changed in order to easily change the hard decision value of the variable node later.

Next, the case in which two or more bits are allocated in order to represent an unreliability value is described.

In an embodiment, the symbol corrector 222C may determine whether the flipping function value is equal to or greater than the second threshold value, which is less than the first threshold value, for each of the variable nodes, of which the flipping function value is less than the first threshold value. When the flipping function value corresponding to the variable node is equal to or greater than the second threshold value and less than the first threshold value, the symbol corrector 222C may update the unreliability value of the corresponding variable node. For example, the symbol corrector 222C may increase the unreliability value of the variable node by a preset value. For example, the symbol corrector 222C may increase the unreliability value of the variable node by 1 or by the flipping function value.

In an embodiment, the symbol corrector 222C may determine whether the flipping function value is equal to or greater than the fourth to n-th threshold values, which are less than the first threshold value, for each of the variable nodes, of which the flipping function value is less than the first threshold value (where n is a natural number that is equal to or greater than 5). For example, when the fourth threshold value and the fifth threshold value, which is less than the fourth threshold value, are used, the symbol corrector 222C may increase the unreliability value of the variable node by a first preset value when the flipping function value is equal to or greater than the fourth threshold value, and may increase the unreliability value of the variable node by a second preset value when the flipping function value is equal to or greater than the fifth threshold value and less than the fourth threshold value. Here, the first preset value may be greater than the second preset value.

When the unreliability value of the variable node is updated, the symbol corrector 222C may determine whether the updated unreliability value is equal to or greater than the third threshold value. The third threshold value may be a positive number. When the updated unreliability value is equal to or greater than the third threshold value, the symbol corrector 222C may change the hard decision value of the variable node to the target candidate symbol corresponding to the current iteration. Based on the same principle as in the above-described example, the symbol corrector 222C may or may not set the unreliability value of the variable node to an initial value when it changes the hard decision value of the variable node based on the unreliability value.

The symbol corrector 222C may provide the hard decision values of the variable nodes to the syndrome checker 230 in each iteration. At least one of the hard decision values of the variable nodes provided to the syndrome checker 230 may be the value modified based on the reliability value or the unreliability value.

The threshold value manager 222D may set threshold values (e.g., first to n-th threshold values), which are criteria for determining whether to modify the variable node value. The threshold values may be set only in the first iteration, or may be additionally set in at least one of the subsequent iterations. The threshold value manager 222D may set the threshold values in consideration of at least one of the degree of the variable node, the number of the iteration, or the number of UCNs corresponding to the previous iteration.

For example, the threshold value manager 222D may set at least one of the first to n-th threshold values higher as the degree of the variable node is higher, and may set at least one of the first to n-th threshold values lower as the degree of the variable node is lower.

For example, the threshold value manager 222D may set at least one of the first to n-th threshold values higher as the number of the iteration increases. In an embodiment, the threshold value manager 222D may set at least one of the first to n-th threshold values lower as the number of the iteration increases.

For example, the threshold value manager 222D may set at least one of the first to n-th threshold values higher as the number of UCNs corresponding to the previous iteration is greater. In an embodiment, the threshold value manager 222D may set at least one of the first to n-th threshold values lower as the number of UCNs corresponding to the previous iteration is greater.

The syndrome checker 230 may perform a syndrome check for the hard decision values (hard decision vector) received from the node processor 220 in response to the i-th iteration. For example, the syndrome check may be performed by checking whether all of the entries of a syndrome vector $S_i$ calculated through Equation (1) are 0.

$$S_i = H \cdot C_i^T \quad (1)$$

Here, $S_i$ denotes the syndrome vector corresponding to the i-th iteration, H denotes the parity check matrix of an error correction code, and $C_i^T$ denotes the transpose of the hard decision vector $C_i$ corresponding to the i-th iteration. Here, the hard decision vector $C_i$ is assumed to be a row vector.

When all of the entries of the syndrome vector $S_i$ are 0, this indicates that the syndrome check has passed, and when there is an entry that is not 0, among all of the entries of the syndrome vector $S_i$, this indicates that the syndrome check has failed.

When the syndrome check passes, the syndrome checker 230 may output the hard decision vector received from the node processor 220 as the decoded codeword.

When the syndrome check fails, the syndrome checker 230 may provide information about the number of unsatisfied check nodes (UCNs) corresponding to the syndrome vector $S_i$ to the node processor 220. Here, the UCNs may correspond to the entries that are not 0, among the entries of the syndrome vector $S_i$.

When the syndrome check does not pass until the number of iterations reaches the maximum number of iterations (I), the syndrome checker 230 may output a fail signal, which indicates that error correction decoding has failed.

Figures 2, 3:
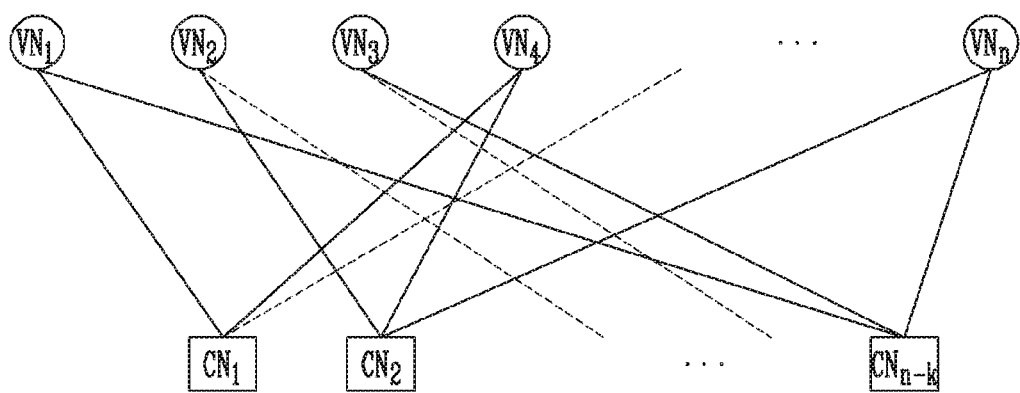
FIG. 2 is an example diagram illustrating a parity check matrix.
FIG. 3 is a diagram in which a parity check matrix illustrated in FIG. 2 is represented as a Tanner graph.

FIG. 2 is an example diagram illustrating a parity check matrix.

FIG. 2 illustrates an example of a parity check matrix H that defines an (n, k) code. The (n, k) code may be defined by a parity check matrix having a size of (n−k)×n. Each of the entries of the parity check matrix may be represented as an element included in a Galois field.

The Galois field GF(q) is a finite field having q elements, and the elements of the Galois field GF(q) may be represented as $\{0, \alpha^0, \alpha^1, \ldots, \alpha^{q-2}\}$ When the number of nonzero entries $\alpha^0, \alpha^1, \ldots, \alpha^{q-2}$ included in the parity check matrix is much smaller than the number of zeros, the (n, k) code may be referred to as an (n, k) LDPC code. Here, n and k may be natural numbers.

A binary LDPC code may have the elements of a GF(2) as the entries thereof, and a non-binary (NB) LDPC code may have the elements of a GF(q) as the entries thereof, (where q>2). FIG. 2 illustrates an example of the parity check matrix of an NB-LDPC code, which has the elements of a GF(4) as the entries thereof.

FIG. 3 is a diagram in which the parity check matrix illustrated in FIG. 2 is represented as a Tanner graph.

An (n, k) code may be represented as a Tanner graph, which is expressed as a bipartite graph. The Tanner graph may be represented using check nodes, variable nodes, and edges. The check nodes correspond to the rows of the parity check matrix, and the variable nodes correspond to the columns thereof. Each of the edges couples one check node to one variable node, and corresponds to a nonzero entry of the parity check matrix.

As illustrated in FIG. 3, the parity check matrix of the (n, k) code illustrated in FIG. 2 may be represented as a Tanner graph including (n−k) check nodes $CN_1$ to $CN_{n-k}$ and n variable nodes $VN_1$ to $VN_n$. The solid lines and the dotted lines coupling the check nodes $CN_1$ to $CN_{n-k}$ to the variable nodes $VN_1$ to $VN_n$ represent edges.

Iterative decoding may be performed through the exchange of messages between the check nodes $CN_1$ to $CN_{n-k}$ and the variable nodes $VN_1$ to $VN_n$ on the Tanner graph illustrated in FIG. 3 according to a message passing algorithm. The variable nodes may perform error correction using C2V messages received from the check nodes coupled thereto, and the check nodes may perform a parity check using V2C messages received from the variable nodes coupled thereto. If the result of an exclusive OR (XOR) operation performed on the hard decision values of all of the variable nodes coupled to any one check node includes only 0s, the check node may be regarded as being satisfied. Conversely, if the result of an XOR operation performed on the hard decision values of all of the variable nodes coupled to any one check node includes an element that is not 0, the check node may be regarded as being unsatisfied, and may be referred to as an UCN. Here, the hard decision values of the variable nodes on which an XOR operation is performed may be the values on which edge gain processing is performed.

Figures 4, 5:
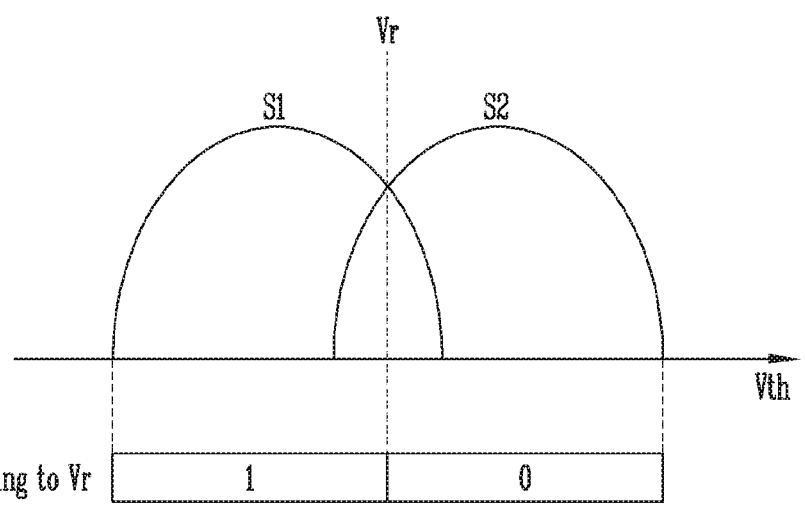
FIG. 4 is an example diagram for explaining a syndrome vector calculated using a parity check matrix illustrated in FIG. 2.
FIG. 5 is an example diagram illustrating for explaining a read value.

FIG. 4 is an example diagram for explaining a syndrome vector that is calculated using the parity check matrix illustrated in FIG. 2.

As described above, a syndrome vector $S_i$ may be generated based on the parity check matrix H and the transpose $C_i^T$ of the hard decision vector $C_i$ corresponding to the i-th iteration. The entries $S_{i1}, S_{i2}, \ldots, S_{in-k}$ of the syndrome vector $S_i$ correspond to the check nodes $CN_1$ to $CN_{n-k}$ on the Tanner graph illustrated in FIG. 3.

When all of the entries $S_{i1}, S_{i2}, \ldots, S_{in-k}$ of the syndrome vector $S_i$ are 0, this indicates that the syndrome check has passed in the i-th iteration. This means that error correction decoding is successfully performed in the i-th iteration. Accordingly, iterative decoding for the current read vector is terminated, and the hard decision vector $C_i$ corresponding to the i-th iteration may be output as a decoded codeword.

If at least one of the entries $S_{i1}, S_{i2}, \ldots, S_{in-k}$ of the syndrome vector $S_i$ is not 0, this indicates that the syndrome check has failed in the i-th iteration. This means that error correction decoding has failed in the i-th iteration, and the next iteration may be performed if the number of the iteration does not reach the maximum number of iterations (I). If the number of the iteration reaches the maximum number of iterations (I), iterative decoding for the current read vector may be terminated.

FIG. 5 is an example diagram for explaining a read value.

FIG. 5 illustrates the distribution of the threshold voltage Vth of memory cells, each of which has any one state among a first state S1 and a second state S2.

In order to acquire a single read vector corresponding to a single codeword, one read voltage Vr1 may be applied to a plurality of memory cells, which store one codeword (e.g., the memory cells of a single page). Accordingly, one read value may be acquired for each memory cell. A single read vector may include the read values corresponding to the multiple memory cells.

For example, when the first read voltage Vr1 is applied to a plurality of memory cells, the read value for the memory cell having a threshold voltage that is lower than the first read voltage Vr1 may be represented as '1', and the read value for the memory cell having a threshold voltage that is higher than the first read voltage Vr1 may be represented as '0'.

Figure 6:
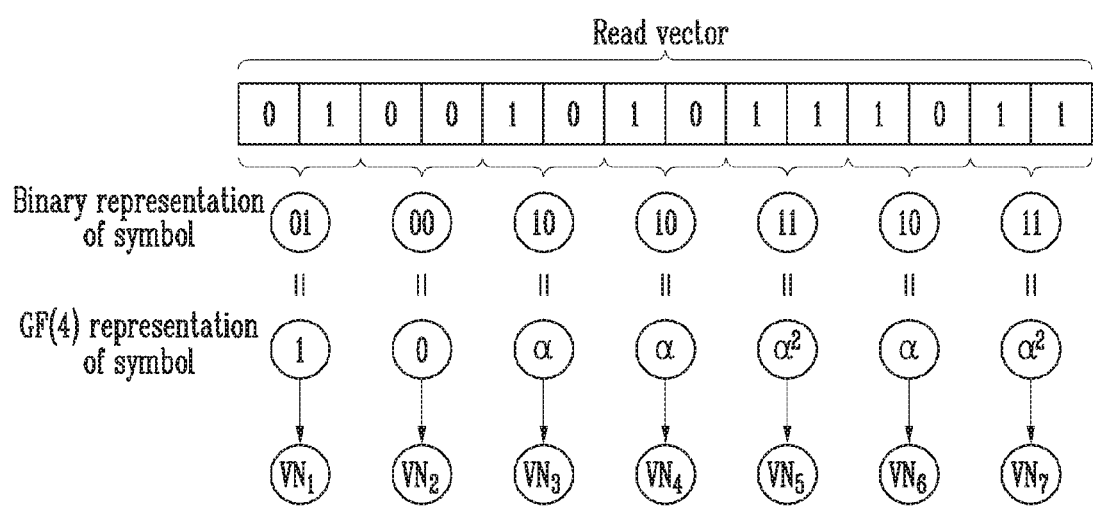
FIG. 6 is an example diagram illustrating a symbol configuration process based on some implementations of the disclosed technology.

FIG. 6 is an example diagram illustrating the process of configuring a symbol according to an embodiment of the disclosed technology.

In the embodiment described with reference to FIG. 6, it is assumed that the read vector received from the channel includes 14 read values.

The error correction decoder may form a plurality of symbols by grouping the read values included in the read vector into the symbols having a preset number of read values. For example, when a GF(4) is used, the error correction decoder may form a single symbol by grouping two read values. Because the read vector includes 14 read values, the error correction decoder may form a total of seven symbols. The error correction decoder may assign the corresponding symbols to the variable nodes $VN_1$ to $VN_7$, respectively.

Hereinafter, it is assumed that the binary representation '00' corresponds to the GF(4) representation '0', the binary representation '01' corresponds to the GF(4) representation '1', the binary representation '10' corresponds to the GF(4) representation '$\alpha$', and the binary representation '11' corresponds to the GF(4) representation '$\alpha^2$'.

Figure 7:
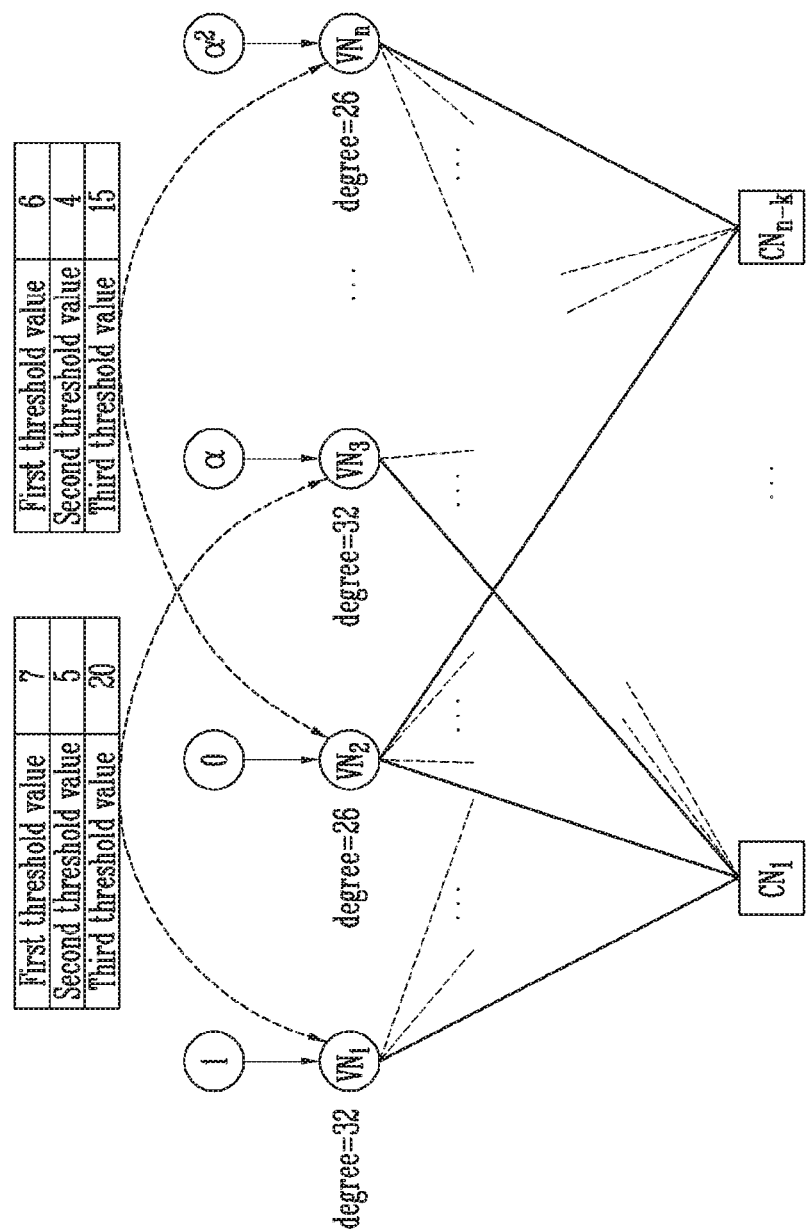
FIG. 7 is an example diagram for explaining threshold values based on some implementations of the disclosed technology.

FIG. 7 is an example diagram for explaining threshold values according to an embodiment of the disclosed technology.

As described above, for each of the variable nodes, one or more threshold values can be set based on whether an unreliability value is used and how many bits are allocated to an unreliability value, if any.

In case that a reliability value is used only without an unreliability value, a first threshold value is set for each of the variable nodes.

In case that a reliability value and an unreliability value are used together and one bit is allocated to each of the variable nodes in order to represent the unreliability value, a first threshold value and a second threshold value are set for each of the variable nodes.

In case that a reliability value and an unreliability value are used together and two or more bits are allocated to each of the variable nodes in order to represent the unreliability value, first to n-th threshold values are set for each of the variable nodes.

Meanwhile, as described above, at least one of the threshold values may be set based on at least one of the degree of the variable node, the number of the iteration, or the number of UCNs corresponding to the previous iteration.

FIG. 7 illustrates an example in which the first to third threshold values are set depending on the degree of the variable node. Referring to FIG. 7, it may be confirmed that higher threshold values are set for the variable nodes $VN_1$ and $VN_3$ having a higher degree (32), and lower threshold values are set for the variable nodes $VN_2$ and $VN_n$ having a lower degree (26).

Figure 8:
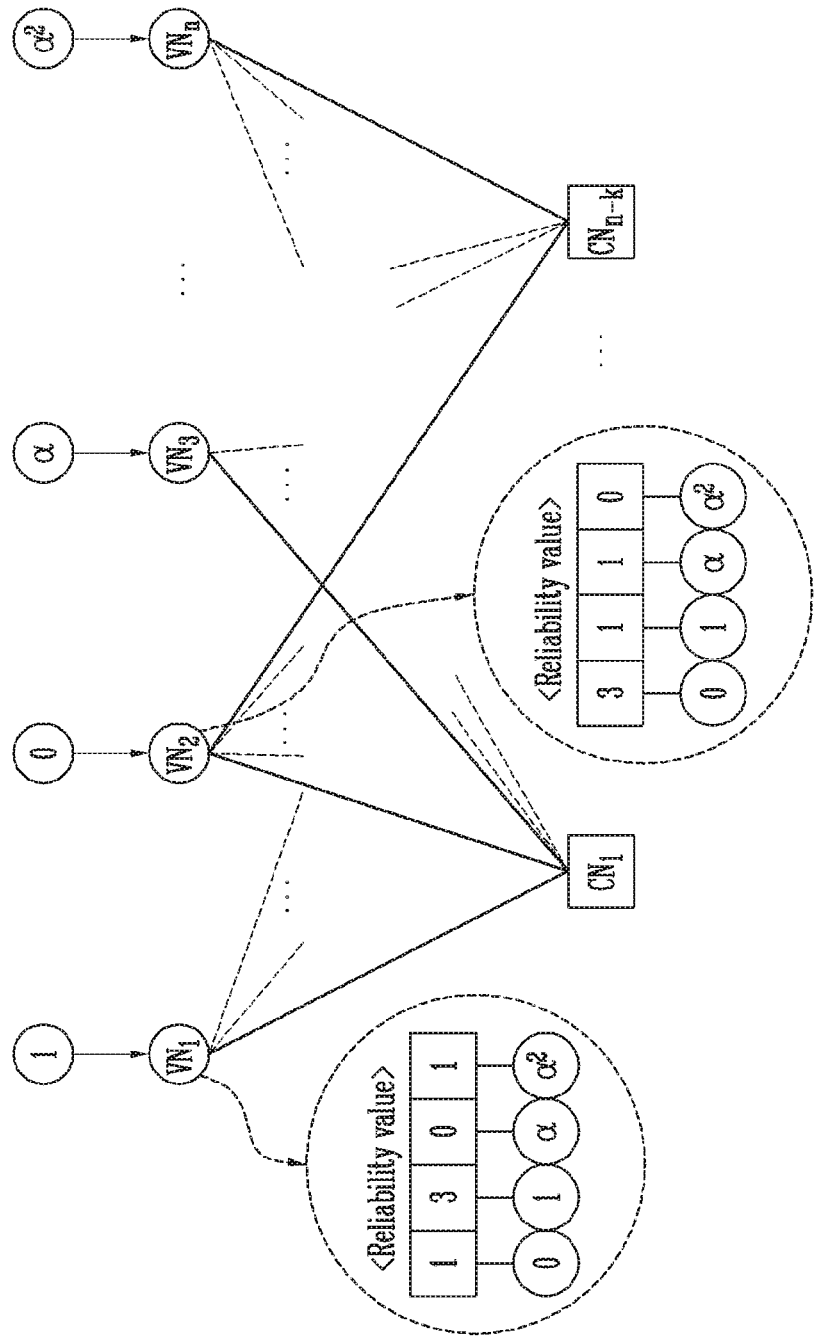
FIG. 8 is an example diagram illustrating the process of setting a reliability value based on some implementations of the disclosed technology.

FIG. 8 is an example diagram illustrating a process of setting a reliability value according to an embodiment of the disclosed technology.

For the convenience of description, FIG. 8 illustrates only some variable nodes and some check nodes on the Tanner graph. For the convenience of description, only two variable nodes $VN_1$ and $VN_2$ are described in embodiments with reference to FIG. 8, but the same description can be also applied to the remaining variable nodes $VN_3$ to $VN_n$.

In the embodiment described with reference to FIG. 8, it is assumed that a GF(4) is used, the initial symbol '1' is assigned to the variable node $VN_1$, the initial symbol '0' is assigned to the variable node $VN_2$, the initial symbol '$\alpha$' is assigned to the variable node $VN_3$, and the initial symbol '$\alpha^2$' is assigned to the variable node $VN_n$.

As described above, the reliability values of the candidate symbols may be set based on at least one of the hamming distances between each of the candidate symbols and the initial symbol, the number of the iteration, or the number of UCNs corresponding to the previous iteration.

FIG. 8 illustrates an example in which the reliability values of the candidate symbols are set based on the hamming distances between each of the candidate symbols and the initial symbol.

In the case of the variable node $VN_1$, the reliability value of the candidate symbol '1' is set to the highest value, 3, because the hamming distance from the initial symbol '1' is 0, which is the smallest hamming distance, the reliability value of each of the candidate symbols '0' and '$\alpha^2$' is set to the second highest value, 1, because the hamming distance from the initial symbol '1' is 1, which is the second smallest hamming distance, and the reliability value of the candidate symbol '$\alpha$' is set to the lowest value, 0, because the hamming distance from the initial symbol '1' is 2, which is the largest hamming distance.

In the case of the variable node $VN_2$, the reliability value of the candidate symbol '0' is set to the highest value, 3, because the hamming distance from the initial symbol '0' is 0, which is the smallest hamming distance, the reliability value of each of the candidate symbols '1' and '$\alpha$' is set to the second highest value, 1, because the hamming distance from the initial symbol '0' is 1, which is the second smallest hamming distance, and the reliability value of the candidate symbol '$\alpha^2$' is set to the lowest value, 0, because the hamming distance from the initial symbol '0' is 2, which is the largest hamming distance.

Figure 9:
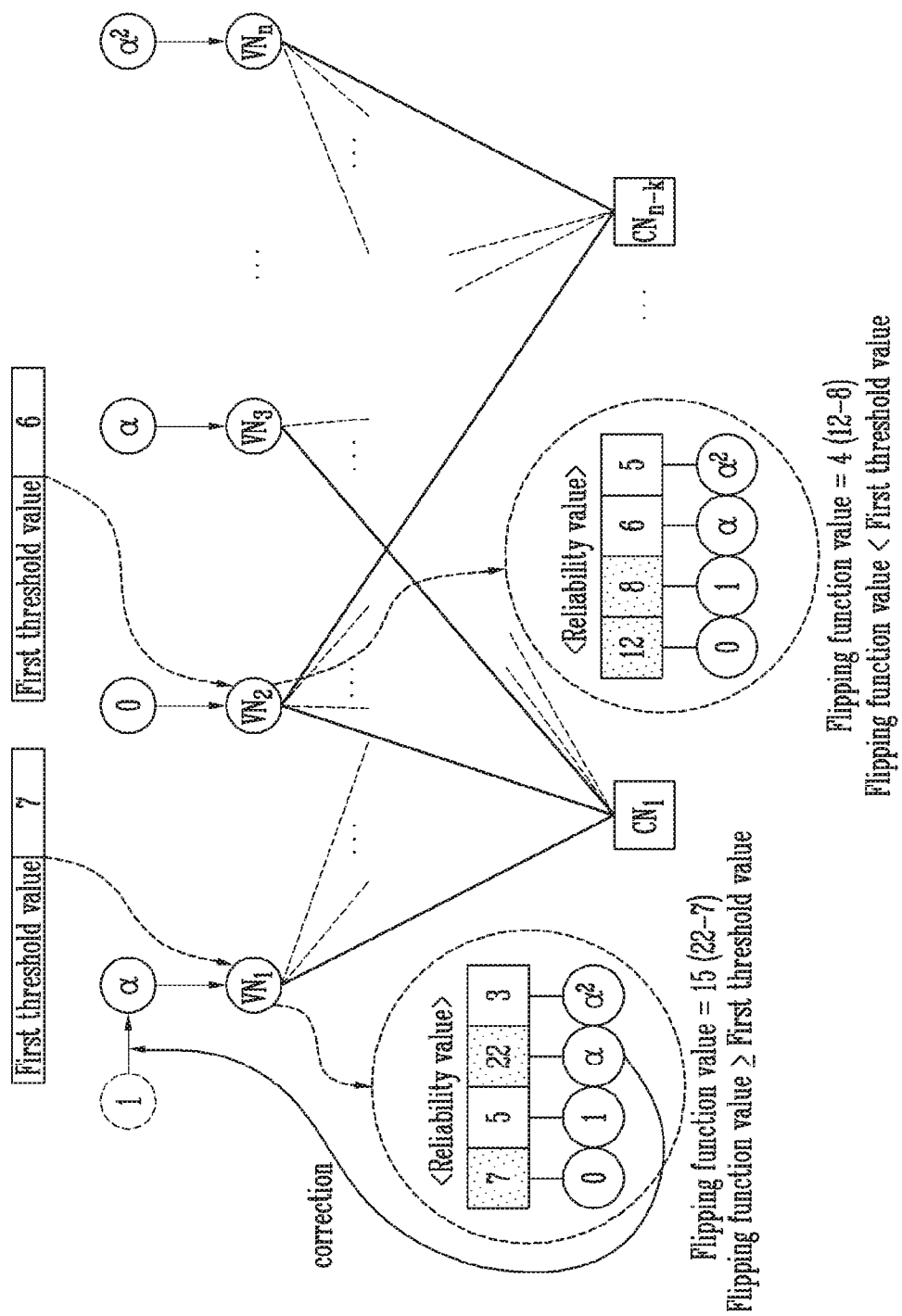
FIGS. 9 to 15 are example diagrams illustrating the process of modifying a hard decision value based on some implementations of the disclosed technology.

FIG. 9 is an example diagram illustrating the process of modifying a hard decision value according to an embodiment of the disclosed technology.

In each iteration, the reliability values of the candidate symbols corresponding to each of the variable nodes $VN_1$ to $VN_n$ may be updated depending on the C2V messages input for each of the variable nodes $VN_1$ to $VN_n$. For example, the reliability value of a predetermined candidate symbol may increase based on the number of received C2V messages representing the predetermined candidate symbol. For example, when one C2V message representing the candidate symbol '$\alpha$' is received, the reliability value of the candidate symbol '$\alpha$' may increase by 1, and when two C2V messages representing the candidate symbol '$\alpha$' are received, the reliability value of the candidate symbol '$\alpha$' may increase by 2.

In the embodiment described with reference to FIG. 9, it is assumed that, after the setting process described with reference to FIG. 8, the variable node $VN_1$ receives six C2V messages representing the candidate symbol '0', two C2V messages representing the candidate symbol '1', 22 C2V messages representing the candidate symbol '$\alpha$', and two C2V messages representing the candidate symbol '$\alpha^2$'. Also, it is assumed that the variable node $VN_2$ receives nine C2V messages representing the candidate symbol '0', seven C2V messages representing the candidate symbol '1', five C2V messages representing the candidate symbol '$\alpha$', and five C2V messages representing the candidate symbol '$\alpha^2$'.

Accordingly, the reliability value for the candidate symbol '0' of the variable node $VN_1$ may be updated from 1 to 7, the reliability value for the candidate symbol '1' of the variable node $VN_1$ may be updated from 3 to 5, the reliability value for the candidate symbol '$\alpha$' of the variable node $VN_1$ may be updated from 0 to 22, and the reliability value for the candidate symbol '$\alpha^2$' of the variable node $VN_1$ may be updated from 1 to 3.

Also, the reliability value for the candidate symbol '0' of the variable node $VN_2$ may be updated from 3 to 12, the reliability value for the candidate symbol '1' of the variable node $VN_2$ may be updated from 1 to 8, the reliability value for the candidate symbol '$\alpha$' of the variable node $VN_2$ may be updated from 1 to 6, and the reliability value for the candidate symbol '$\alpha^2$' of the variable node $VN_2$ may be updated from 0 to 5.

After the reliability values are updated, a flipping function value may be calculated for each of the variable nodes. As described above, the flipping function value may be calculated by subtracting a second function value from a first function value, the first function value being related to the updated reliability value of a target candidate symbol and the second function value being related to one or more of updated reliability values of the remaining candidate symbols other than the target candidate symbol.

In the embodiment described with reference to FIG. 9, the target candidate symbol is assumed to be the candidate symbol corresponding to the largest value, among the updated reliability values. Also, the first function value is assumed to be the updated reliability value of the target candidate symbol which is the largest value among the updated reliability values of the candidate symbols. Also, the second function value is assumed to be the second largest value among the updated reliability values.

In the example of FIG. 9, for the variable node $VN_1$, the largest value among the updated reliability values of the candidate symbols is 22 and the second largest value is 7. Thus, the first function value becomes 22, and the second function value becomes 7. Accordingly, the flipping function value becomes 15, which is calculated by subtracting the second function value (7) from the first function value (22). When the flipping function value is equal to or greater than the first threshold value, the hard decision value of the variable node $VN_1$ may be changed to the target candidate symbol. Because the first threshold value corresponding to the variable node $VN_1$ is 7 and the flipping function value is 15, the hard decision value of the variable node $VN_1$ may be changed to the target candidate symbol, that is, '$\alpha$'.

In the example of FIG. 9, for the variable node $VN_2$, the largest value among the updated reliability values of the candidate symbols is 12 and the second largest value is 8. That is, the first function value becomes 12, and the second function value becomes 8. Accordingly, the flipping function value becomes 4, which is calculated by subtracting the second function value (8) from the first function value (12). When the flipping function value is less than the first threshold value, the hard decision value of the variable node $VN_2$ may be maintained. Because the first threshold value corresponding to the variable node $VN_2$ is 6 and the flipping function value is 4, the hard decision value of the variable node $VN_2$ may be maintained without any changes.

Figure 10:
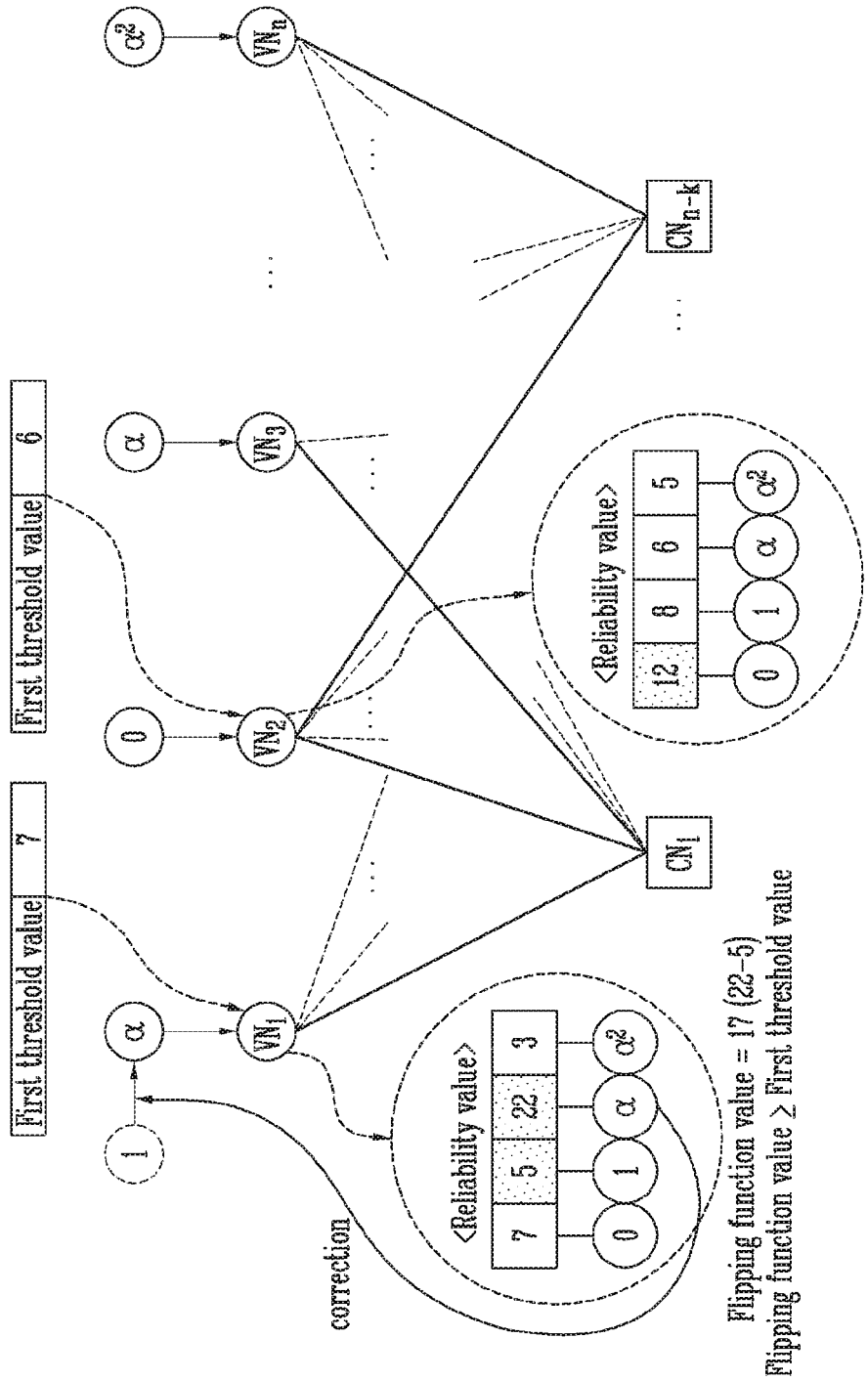

FIG. 10 is an example diagram illustrating a process of modifying a hard decision value according to an embodiment of the disclosed technology.

In explaining the embodiment described with reference to FIG. 10, a description which has been explained with reference to FIG. 9 will be omitted.

In the embodiment described with reference to FIG. 10, it is assumed that, after the setting process described with reference to FIG. 8, the reliability values of the candidate symbols of the variable nodes $VN_1$ and $VN_2$ are updated depending on the C2V messages received by the variable nodes $VN_1$ and $VN_2$. The reliability values of the candidate symbols of the variable nodes $VN_1$ and $VN_2$ are assumed to be updated in the same manner as described with reference to FIG. 9.

In the embodiment described with reference to FIG. 10, the target candidate symbol is the candidate symbol whose updated reliability value is largest among the updated reliability values of candidate symbols, and the first function value is assumed to be the updated reliability value of the target candidate symbol.

In the embodiment described with reference to FIG. 10, the second function value is assumed to be the updated reliability value of the candidate symbol that is the same as the current hard decision value.

In the example of FIG. 10, for the variable node $VN_1$, the largest value among the updated reliability values of the candidate symbols is 22, and the updated reliability value of the candidate symbol '1' that is the same as the hard decision value of the variable node $VN_1$ is 5. Thus, the first function value becomes 22, and the second function value becomes 5. Accordingly, the flipping function value becomes 17, which is calculated by subtracting the second function value (5) from the first function value (22). When the flipping function value is equal to or greater than the first threshold value, the hard decision value of the variable node $VN_1$ may be changed to the target candidate symbol. Because the first threshold value corresponding to the variable node $VN_1$ is 7 and the flipping function value is 17, the hard decision value of the variable node $VN_1$ may be changed to the target candidate symbol, that is, 'α'.

In the example of FIG. 10, for the variable node $VN_2$, the largest value among the updated reliability values of the candidate symbols is 12 corresponding to the candidate symbol '0.' Thus, the candidate symbol having the largest updated reliability value is the same as the current hard decision value. In this case, the flipping function value is not calculated, and the hard decision value of the variable node $VN_2$ may be maintained without any changes.

Figure 11:
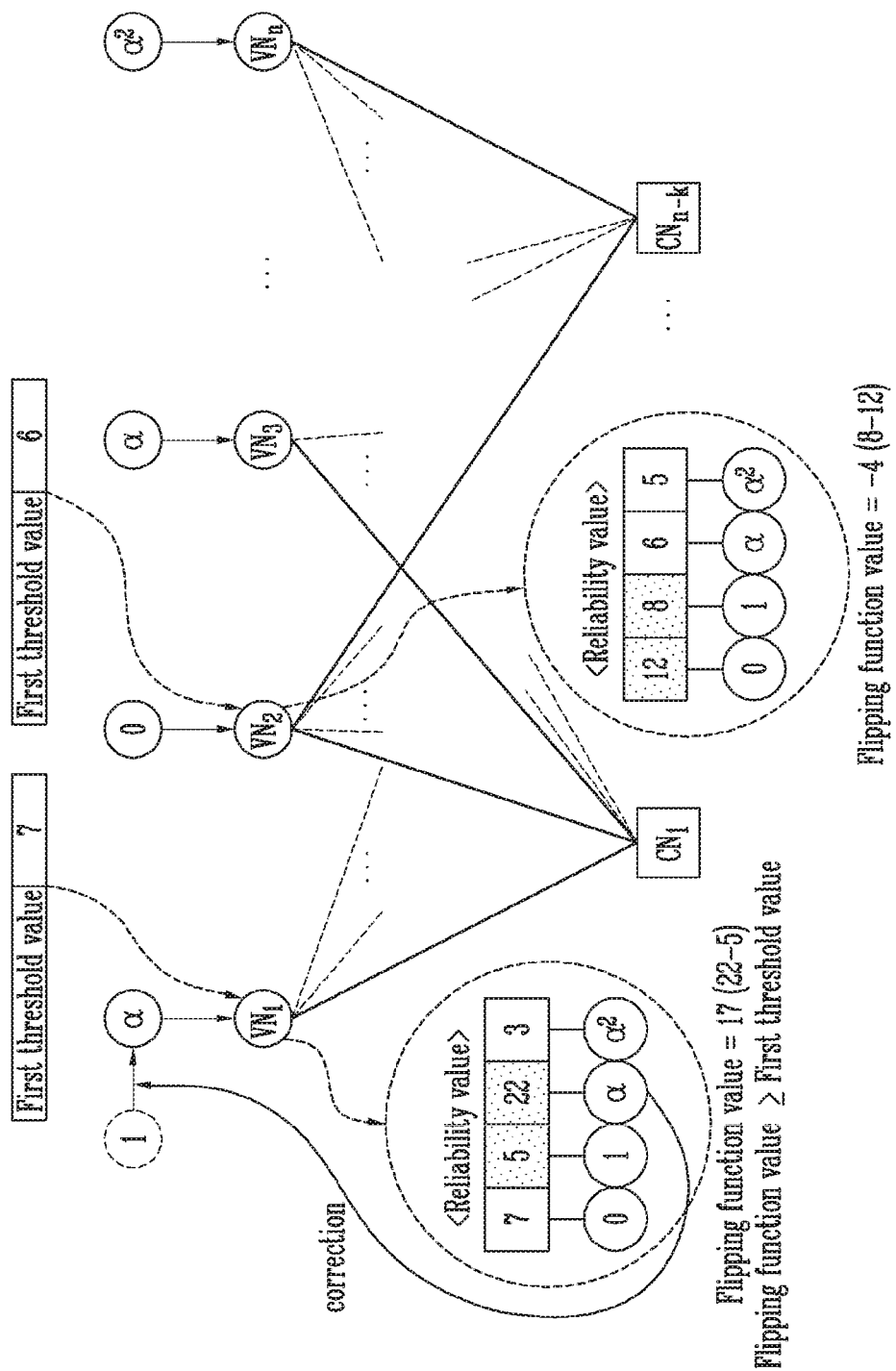

FIG. 11 is an example diagram illustrating a process of modifying a hard decision value according to an embodiment of the disclosed technology.

In explaining the embodiment described with reference to FIG. 11, α description which has been explained with reference to FIG. 9 will be omitted.

In the embodiment described with reference to FIG. 11, it is assumed that, after the setting process described with reference to FIG. 8, the reliability values of the candidate symbols of the variable nodes $VN_1$ and $VN_2$ are updated depending on the C2V messages received by the variable nodes $VN_1$ and $VN_2$. The reliability values of the candidate symbols of the variable nodes $VN_1$ and $VN_2$ are assumed to be updated in the same manner as is described with reference to FIG. 9.

In the embodiment described with reference to FIG. 11, the target candidate symbol is the candidate symbol which is not same as the current hard decision value and whose updated reliability value is largest among the remaining updated reliability values. Thus, the target candidate symbol has the largest updated reliability value among the updated reliability values of the candidate symbols other than the candidate symbol that is the same as the current hard decision value. The first function value is assumed to be the updated reliability value of the target candidate symbol.

In the embodiment described with reference to FIG. 11, the second function value is assumed to be the updated reliability value of the candidate symbol that is the same as the current hard decision value.

In the example of FIG. 11, for the variable node $VN_1$, since the current hard decision value is 1, the candidate symbol '1,' which is same as the current hard decision value, is excluded from the target candidate symbol. The largest updated reliability value is 22 and the corresponding candidate symbol is 'α' (which is not same as the current hard decision value of 1). Thus, 'α' become the target candidate symbol and the first function value becomes 22. The updated reliability value of the candidate symbol '1' that is the same as the current hard decision value is 5. Thus, the second function value becomes 5. Accordingly, the flipping function value becomes 17, which is calculated by subtracting the second function value (5) from the first function value (22). When the flipping function value is equal to or greater than the first threshold value, the hard decision value of the variable node $VN_1$ may be changed to the target candidate symbol. Because the first threshold value corresponding to the variable node $VN_1$ is 7 and the flipping function value is 17, the hard decision value of the variable node $VN_1$ may be changed to the target candidate symbol, that is, 'α'.

In the example of FIG. 11, for the variable node $VN_2$, since the current hard decision value is '0,' the candidate symbol '0,' which is same as the current hard decision value, is excluded from the target candidate symbol. The largest updated reliability value is 12 but the corresponding candidate symbol is '0' which is same as the current hard decision value of 0. Among the remaining updated reliability values other than the updated reliability value of the candidate symbol '0' that is the same as the current hard decision value, the largest value is 8. The updated reliability value of the candidate symbol '0' that is the same as the current hard decision value is 12. Accordingly, the flipping function value becomes −4, which is calculated by subtracting the second function value (12) from the first function value (8). In the embodiment described with reference to FIG. 11, when the flipping function value is not a positive number, this may mean that the current hard decision value is a reliable estimate. Therefore, in this case, the comparison of the flipping function value with the first threshold value is skipped, and the hard decision value of the variable node $VN_2$ may be maintained.

Figure 12:
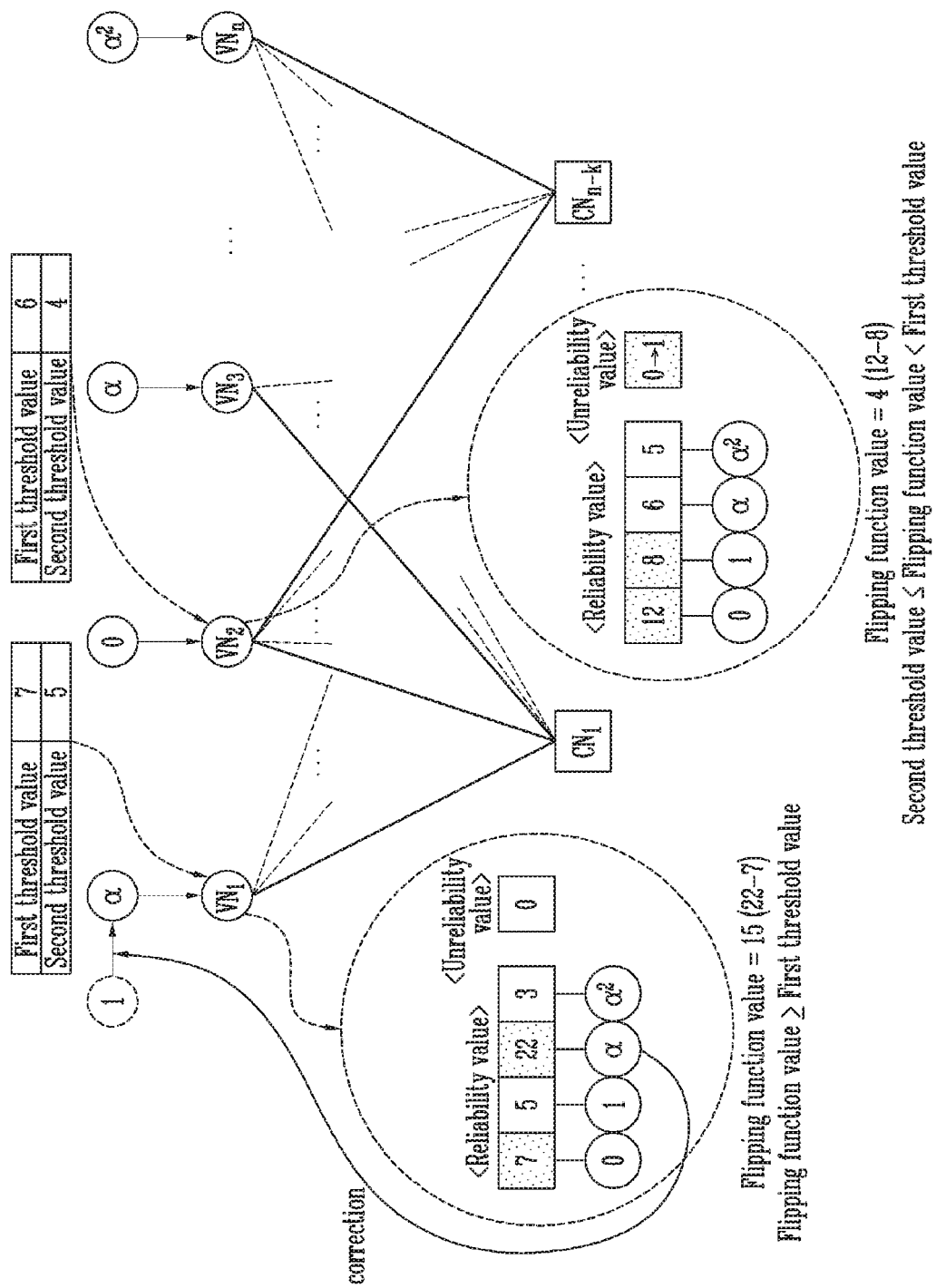

FIG. 12 is an example diagram illustrating the process of modifying a hard decision value according to an embodiment of the disclosed technology.

In the embodiment described with reference to FIG. 12, the unreliability values of the variable nodes are additionally used, and it is assumed that one bit is allocated to each of the variable nodes in order to represent the unreliability value. Also, it is assumed that the unreliability values are initially set to an initial value 0.

In explaining the embodiment described with reference to FIG. 12, a description which has been explained with reference to FIG. 9 will be omitted.

In the embodiment described with reference to FIG. 12, it is assumed that, after the setting process described with reference to FIG. 8, the reliability values of the candidate symbols of the variable nodes $VN_1$ and $VN_2$ are updated based on the C2V messages received by the variable nodes $VN_1$ and $VN_2$. The reliability values of the candidate symbols of the variable nodes $VN_1$ and $VN_2$ are assumed to be updated in the same manner as is described with reference to FIG. 9.

In the embodiment described with reference to FIG. 12, the target candidate symbol is the candidate symbol whose updated reliability value is largest among the updated reliability values of candidate symbols, and the first function value is assumed to be the updated reliability value of the target candidate symbol.

In the embodiment described with reference to FIG. 12, the second function value is assumed to be the second largest value, among the updated reliability values.

For the variable node $VN_1$, the symbol correction may be performed based on the same principle as that described with reference to FIG. 9.

In the example of FIG. 12, for the variable node $VN_2$, the largest value among the updated reliability values of the candidate symbols is 12 and the second largest value is 8. Thus, the first function value becomes 12, and the second function value becomes 8. Accordingly, the flipping function value becomes 4, which is calculated by subtracting the second function value (8) from the first function value (12). When the flipping function value is equal to or greater than the second threshold value and less than the first threshold value and when the unreliability value of the variable node $VN_2$ is not changed from the initial value, the unreliability value of the variable node $VN_2$ may be changed. For the variable node $VN_2$, the first threshold value is 6, the second threshold value is 4, the flipping function value is 4, and the unreliability value of the variable node $VN_2$ is not changed from the initial value 0. Accordingly, the unreliability value of the variable node $VN_2$ may be changed to 1. Also, the hard decision value of the variable node $VN_2$ may be maintained.

Figure 13:
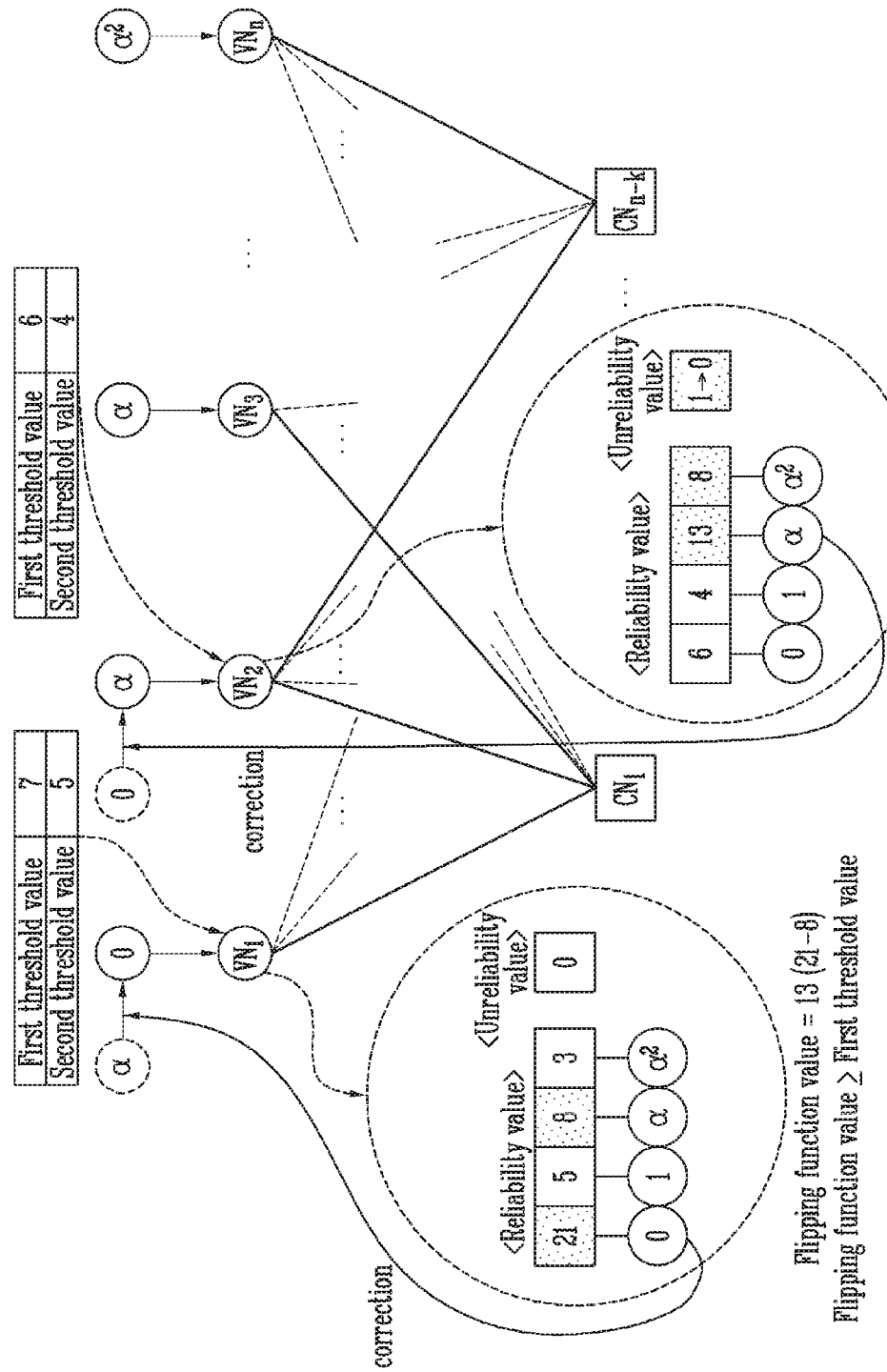

FIG. 13 is an example diagram illustrating the process of modifying a hard decision value according to an embodiment of the disclosed technology.

FIG. 13 illustrates an example in which, after symbol correction is performed and the unreliability value is set as described with reference to FIG. 12, C2V messages are received in the subsequent iteration in which the reliability value is set and the unreliability value is maintained.

In the embodiment described with reference to FIG. 13, the reliability values of the candidate symbols may be updated based on a similar or same principle as in the above-described embodiments, and a detailed description thereof will be omitted.

In the embodiment described with reference to FIG. 13, the target candidate symbol is the candidate symbol whose updated reliability value is the largest value among the updated reliability values, and the first function value is assumed to be the updated reliability value of the target candidate symbol.

In the embodiment described with reference to FIG. 13, the second function value is assumed to be the second largest value among the updated reliability values.

For the variable node $VN_1$, the hard decision value may be modified based on a similar or same principle as that described with reference to FIG. 9.

In the example of FIG. 13, for the variable node $VN_2$, the largest value among the updated reliability values of the candidate symbols is 13 and the second largest value is 8. Thus, the first function value becomes 13, and the second function value becomes 8. Accordingly, the flipping function value becomes 5, which is calculated by subtracting the second function value (8) from the first function value (13). When the flipping function value is equal to or greater than the second threshold value and less than the first threshold value and when the unreliability value of the variable node $VN_2$ is changed from an initial value, the hard decision value of the variable node $VN_2$ may be changed to the target candidate symbol. For the variable node $VN_2$, the first threshold value is 6, the second threshold value is 4, the flipping function value is 4, and the unreliability value of the variable node $VN_2$ is changed from the initial value. Accordingly, the hard decision value of the variable node $VN_2$ may be changed to the target candidate symbol 'α'. FIG. 13 illustrates an example in which, after the hard decision value of the variable node $VN_2$ is modified based on the unreliability value, the unreliability value of the variable node $VN_2$ is changed to 0 from 1. In some embodiment, even though the hard decision value of the variable node $VN_2$ is modified based on the unreliability value, the unreliability value of the variable node $VN_2$ may not be changed.

Figure 14:
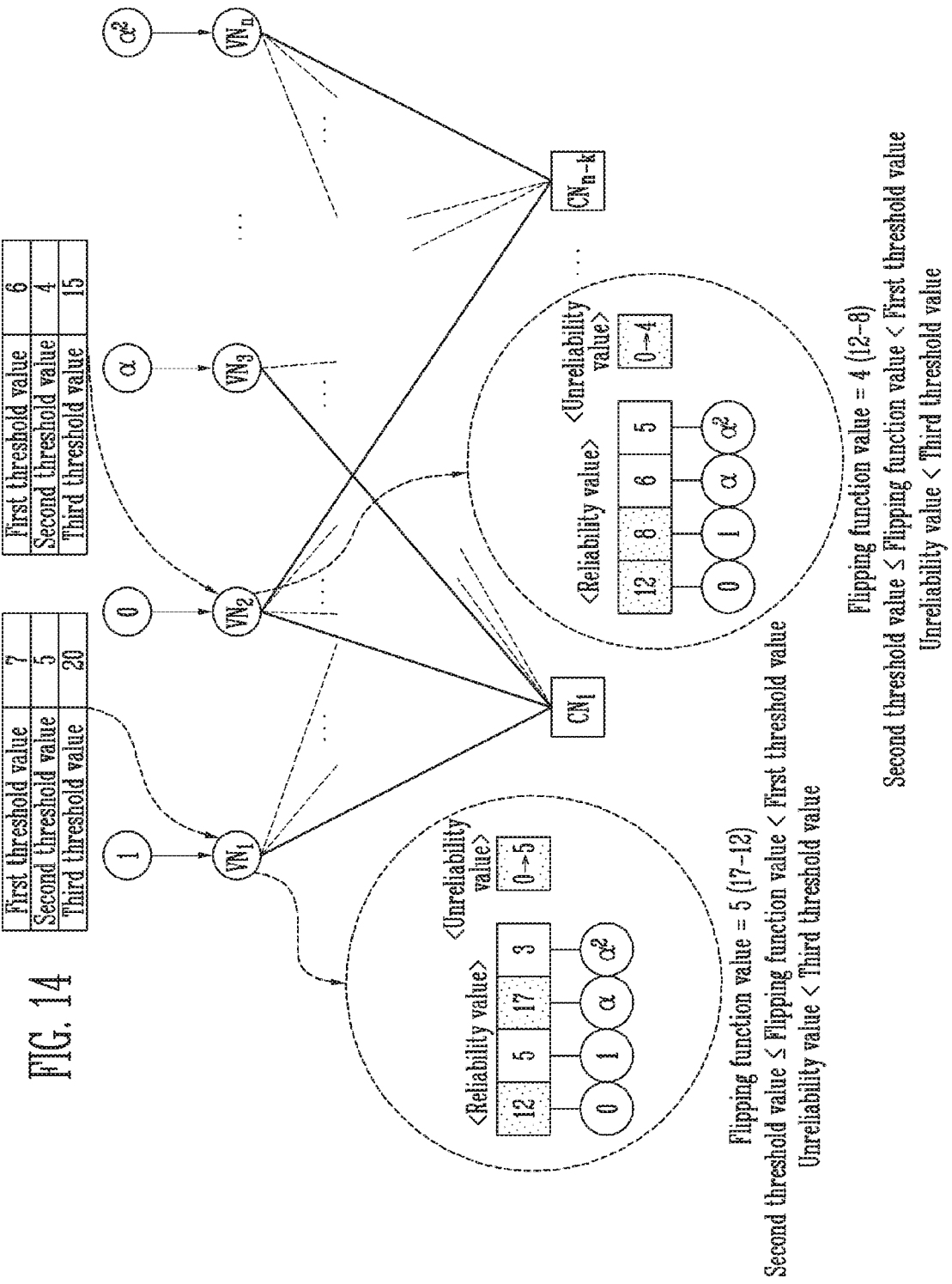

FIG. 14 is an example diagram illustrating a process of modifying a hard decision value according to an embodiment of the disclosed technology.

In explaining the embodiment described with reference to FIG. 14, it is assumed that two or more bits are allocated to each of the variable nodes in order to represent an unreliability value. Also, it is assumed that the unreliability values are initially set to an initial value 0.

In the embodiment described with reference to FIG. 14, it is assumed that, after the setting process described with reference to FIG. 8, the reliability values of the candidate symbols of the variable nodes $VN_1$ and $VN_2$ are updated based on the C2V messages received by the variable nodes $VN_1$ and $VN_2$. In the embodiment described with reference to FIG. 14, the reliability values of the candidate symbols may be updated based on a similar or same principle as in the above-described embodiments, and a detailed description thereof will be omitted.

In the embodiment described with reference to FIG. 14, the target candidate symbol is the candidate symbol whose updated reliability value is the largest among the updated reliability values, and the first function value is assumed to be the updated reliability value of the target candidate symbol. Also, the second function value is assumed to be the second largest value among the updated reliability values.

In the example of FIG. 14, for the variable node $VN_1$, the flipping function value becomes 5, which is calculated by subtracting the second function value (12) from the first function value (17), based on the same principle as in the above-described embodiments. When the flipping function value is equal to or greater than the second threshold value and less than the first threshold value, the unreliability value of the variable node $VN_1$ may be updated depending on a preset value. FIG. 14 illustrates an example in which the unreliability value of the variable node $VN_1$ increases by 5, which is the flipping function value. Meanwhile, when the updated unreliability value is less than the third threshold value, the hard decision value of the variable node $VN_1$ may be maintained. Because the updated unreliability value (5) is less than the third threshold value (20), the hard decision value of the variable node $VN_1$ may be maintained.

For the variable node $VN_2$, the unreliability value may be updated based on the same principle.

Figure 15:
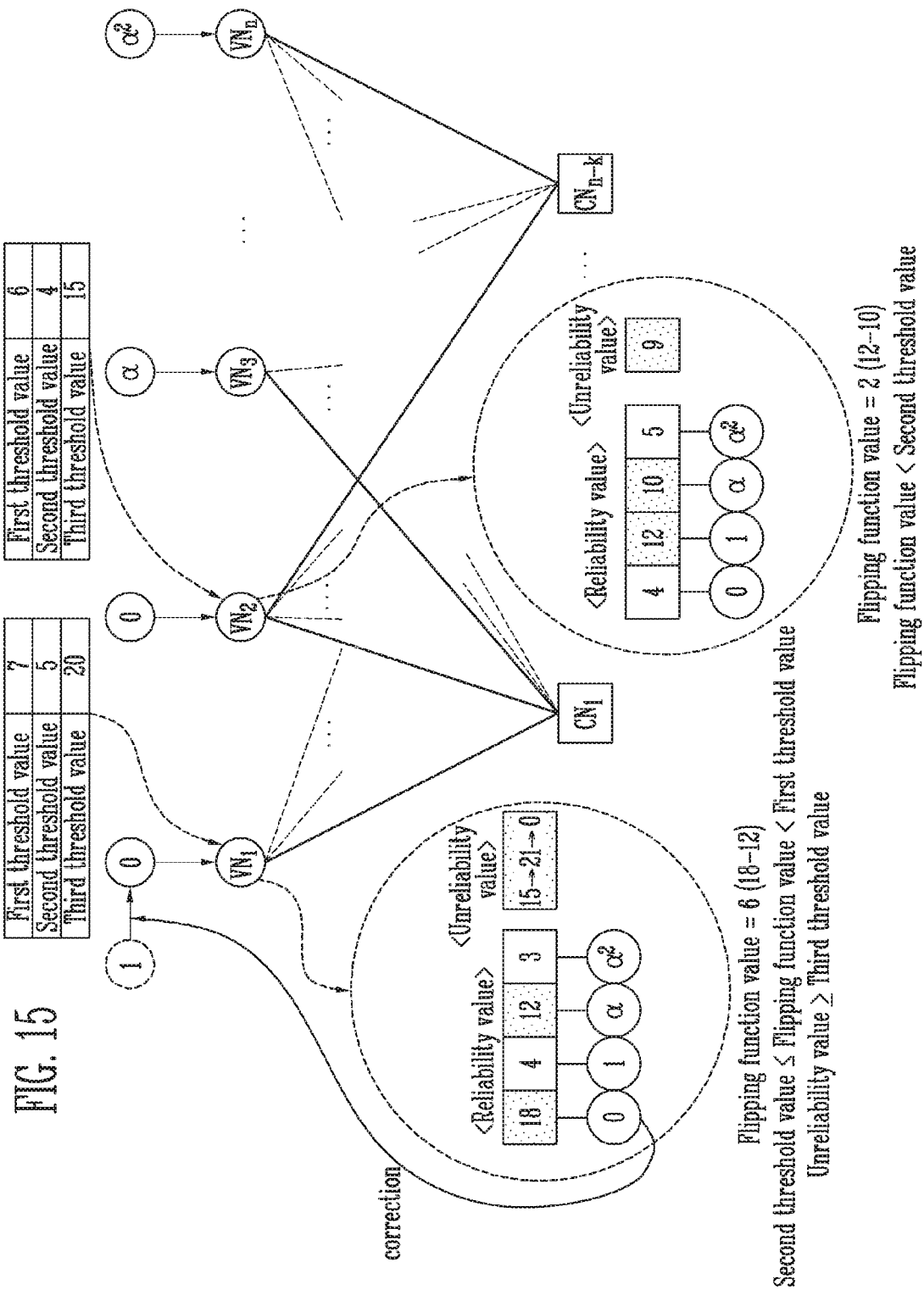

FIG. 15 is an example diagram illustrating the process of modifying a symbol according to an embodiment of the disclosed technology.

In the embodiment described with reference to FIG. 15, it is assumed that the unreliability value of the variable node $VN_1$ and that of the variable node $VN_2$ are updated to 15 and 9, respectively, because additional iterations are performed after the unreliability values are updated as described with reference to FIG. 14.

It is assumed that the reliability values of the candidate symbols corresponding to the variable nodes $VN_1$ and $VN_2$ are updated based on the C2V messages received by the variable nodes $VN_1$ and $VN_2$. In the embodiment described with reference to FIG. 15, the reliability values of the candidate symbols may be updated based on a similar or same principle as in the above-described embodiments, and a detailed description thereof will be omitted.

In the embodiment described with reference to FIG. 15, the target candidate symbol is the candidate symbol whose updated reliability value is the largest among the updated reliability values, and the first function value is assumed to be the updated reliability value of the target candidate symbol. Also, the second function value is assumed to be the second largest value among the updated reliability values.

In the example of FIG. 15, for the variable node $VN_1$, the flipping function value becomes 6, which is calculated by subtracting the second function value (12) from the first function value (18), based on a similar or same principle as in the above-described embodiments. When the flipping function value is equal to or greater than the second threshold value and less than the first threshold value, the unreliability value of the variable node $VN_1$ may increase by a preset value. FIG. 15 illustrates an example in which the unreliability value of the variable node $VN_1$ increases by 6, which is the flipping function value. When the updated unreliability value is equal to or greater than the third threshold value, the hard decision value of the variable node $VN_1$ may be modified. Because the updated unreliability value (21) is equal to or greater than the third threshold value (20), the hard decision value of the variable node $VN_1$ may be changed to the target candidate symbol, that is, '0'. FIG. 15 illustrates an example in which the unreliability value of the variable node $VN_1$ is changed to 0 from 21 after the hard decision value of the variable node $VN_1$ is modified based on the unreliability value. In an embodiment, even though the hard decision value of the variable node $VN_1$ is modified based on the unreliability value, the unreliability value of the variable node $VN_1$ may not be changed to the initial value 0, as described above.

Because the flipping function value of the variable node $VN_2$ is 2 and is less than the second threshold value (4), both the hard decision value and the unreliability value of the variable node $VN_2$ may be maintained.

Figure 16:
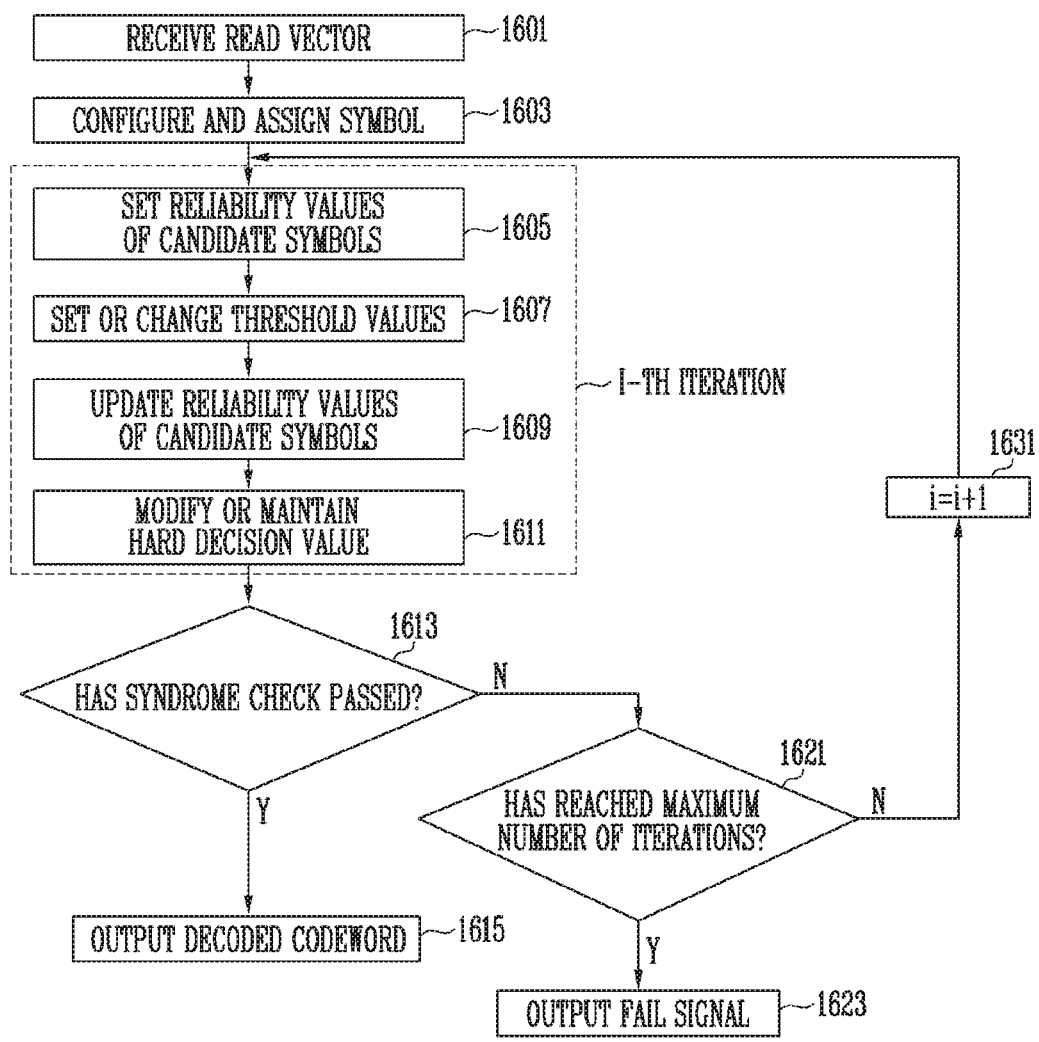
FIGS. 16 to 19 are flowcharts illustrating the method of operating an error correction decoder based on some implementations of the disclosed technology.

FIG. 16 is a flowchart illustrating the method of operating an error correction decoder according to an embodiment of the disclosed technology.

According to an embodiment, at least one of the steps illustrated in FIG. 16 may be skipped, and the order in which the steps are performed may be changed. For example, step 1607 may be skipped, and step 1607 may be performed before step 1605.

At step 1601, the error correction decoder may receive a read vector corresponding to a codeword.

At step 1603, the error correction decoder may form symbols by grouping the read values included in the read vector, and may assign the formed symbols to variable nodes, respectively.

At steps 1605 to 1611, the i-th iteration may be performed.

At step 1605, the error correction decoder may set the reliability values of candidate symbols corresponding to each of the variable nodes. For each of the variable nodes, the error correction decoder may set the reliability values of the candidate symbols, which can be selected as the hard decision value of the variable node based on the initial symbol assigned to the variable node. In an embodiment, the error correction decoder may set the reliability values of the candidate symbols in consideration of at least one of the hamming distance from the initial symbol, the number of the iteration, or the number of UCNs corresponding to the previous iteration. When the first iteration is performed, the unreliability value of each of the variable nodes may be set to an initial value.

At step 1607, the error correction decoder may set or change threshold values, which are criteria for determining whether to modify the hard decision value of the variable node. In the first iteration, the error correction decoder may set the threshold values in consideration of the degree of the variable node. In the iterations after the first iteration, the error correction decoder may change the threshold values in consideration of at least one of the number of the iteration or the number of UCNs corresponding to the previous iteration.

At step 1609, the error correction decoder may update the reliability values of the candidate symbols. For example, the error correction decoder may update the reliability values of the candidate symbols for each of the variable nodes depending on the C2V messages received by the variable nodes.

At step 1611, the error correction decoder may modify or maintain the hard decision values of the variable nodes. Step 1611 will be described in detail with reference to FIGS. 17 to 19.

At step 1613, the error correction decoder may perform a syndrome check using the hard decision vector, that is, the hard decision values, which are modified or maintained at step 1611. If the syndrome check has passed (in case of 'Y'), step 1615 may be performed, and if not (in case of 'N'), step 1621 may be performed.

At step 1615, the error correction decoder may output the hard decision vector as a decoded codeword.

Meanwhile, at step 1621, the error correction decoder may check whether the number of iterations that are performed reaches the maximum number of iterations (I). If the number of iterations that are performed reaches the maximum number of iterations (I) (in case of 'Y'), step 1623 is performed, whereby a fail signal, which indicates that error correction decoding has failed, may be output. If the number of iterations that are performed does not reach the maximum number of iterations (I) (in case of 'N'), the (i+1)-th iteration may be performed after passing through step 1631.

Figure 17:
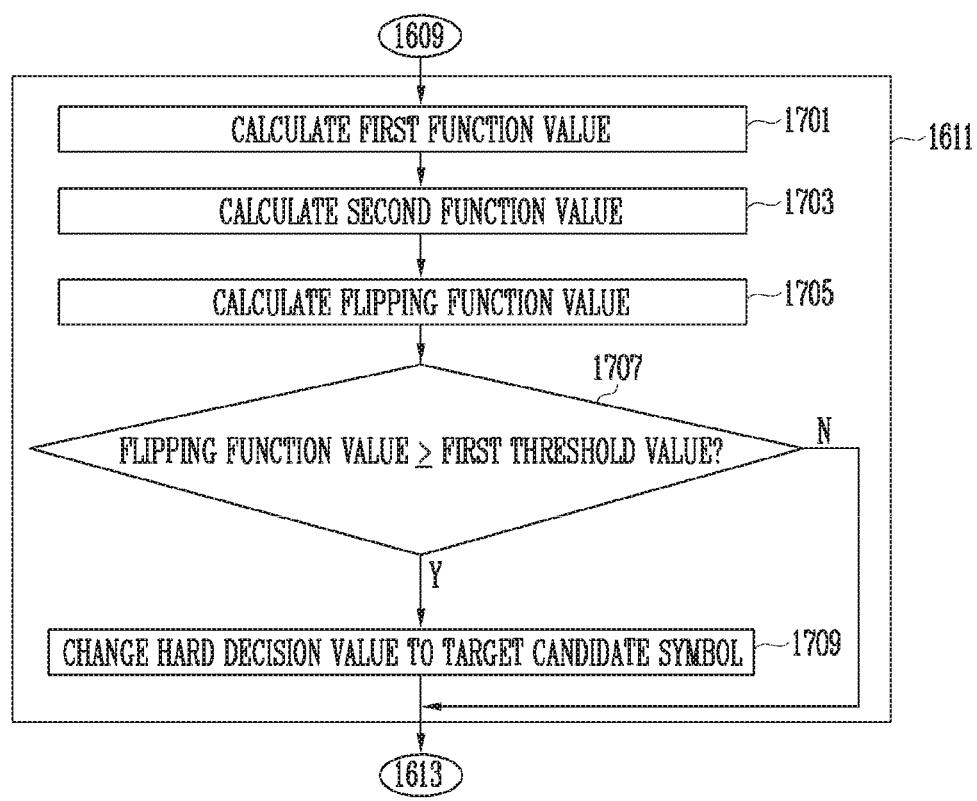

FIG. 17 is a flowchart illustrating the method of operating an error correction decoder according to an embodiment of the disclosed technology.

Steps 1701 to 1709 illustrated in FIG. 17 may be performed for each of the variable nodes.

Steps 1701 to 1709 illustrated in FIG. 17 may be performed when an unreliability value is not used.

At step 1701, the error correction decoder may calculate a first function value, which is related to the updated reliability value of the target candidate symbol.

At step 1703, the error correction decoder may calculate a second function value, which is related to one or more of updated reliability values of the remaining candidate symbols other than the target candidate symbol.

At step 1705, the error correction decoder may calculate a flipping function value. The flipping function value may be a value that is calculated by subtracting the second function value from the first function value.

At step 1707, the error correction decoder may determine whether the flipping function value is equal to or greater than a first threshold value. If the flipping function value is equal to or greater than the first threshold value (in case of 'Y'), step 1709 may be performed, and if not, step 1613 may be performed.

At step 1709, the error correction decoder may change the hard decision value of the variable node to the target candidate symbol.

According to an embodiment, the error correction decoder may check at step 1705 whether the flipping function value is a positive number, and may skip step 1707 and step 1709 when the flipping function value is not a positive number.

Figure 18:
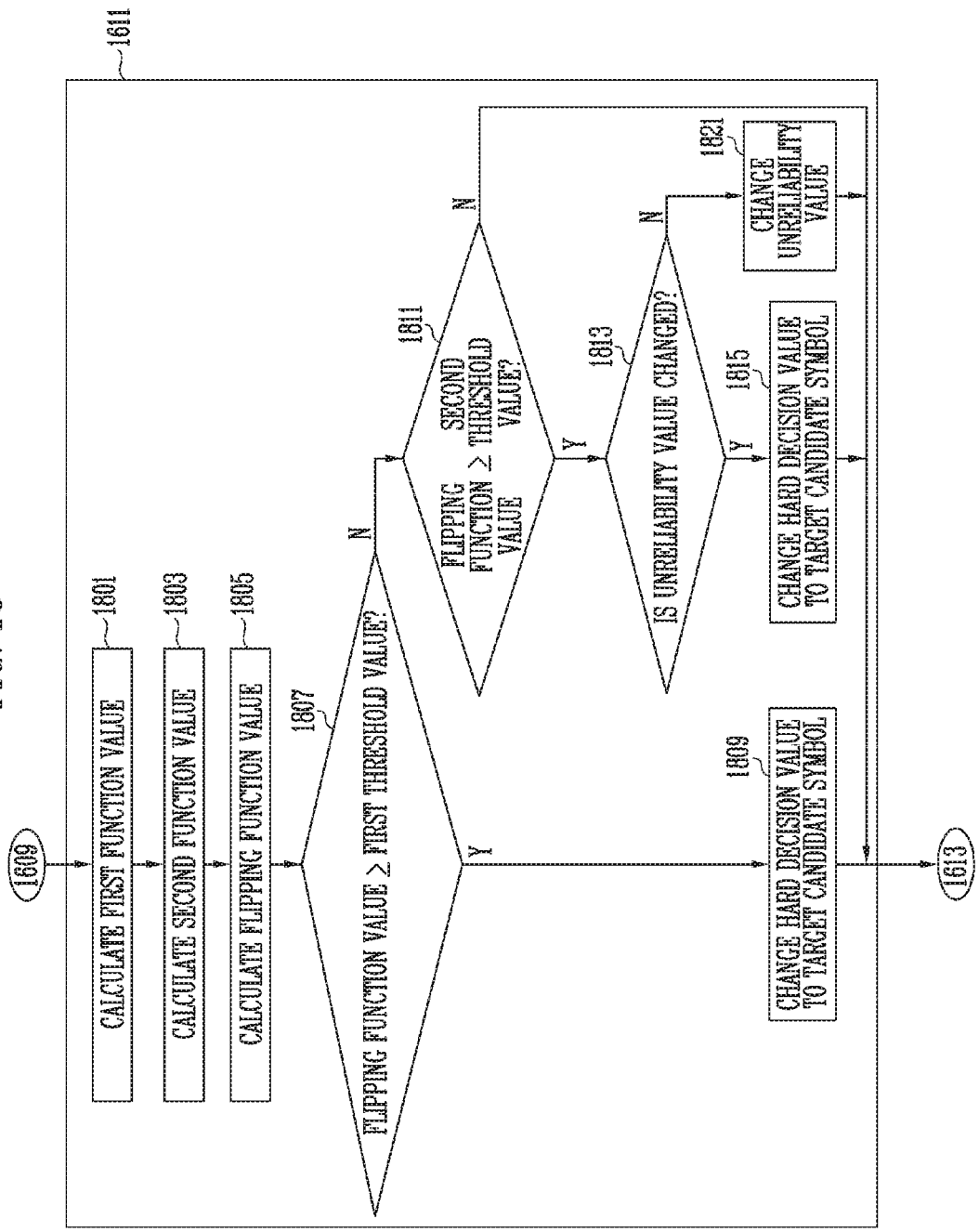

FIG. 18 is a flowchart illustrating the method of operating an error correction decoder according to an embodiment of the disclosed technology.

Steps 1801 to 1821 illustrated in FIG. 18 may be performed for each of the variable nodes.

Steps 1801 to 1821 illustrated in FIG. 18 may be performed when one bit is allocated in order to represent an unreliability value.

At step 1801, the error correction decoder may calculate a first function value, which is related to the updated reliability value of the target candidate symbol.

At step 1803, the error correction decoder may calculate a second function value, which is related to one or more of updated reliability values of the remaining candidate symbols other than the target candidate symbol.

At step 1805, the error correction decoder may calculate a flipping function value. The flipping function value may be a value that is calculated by subtracting the second function value from the first function value.

At step 1807, the error correction decoder may determine whether the flipping function value is equal to or greater than a first threshold value. If the flipping function value is equal to or greater than the first threshold value (in case of 'Y'), step 1809 may be performed, and if not, step 1811 may be performed.

At step 1809, the error correction decoder may change the hard decision value of the variable node to the target candidate symbol. Here, the error correction decoder checks whether the unreliability value is changed from an initial value in the variable node, and may set the unreliability value to the initial value when the unreliability value of the variable node is changed.

At step 1811, the error correction decoder may determine whether the flipping function value is equal to or greater than a second threshold value, which is less than the first threshold value. If the flipping function value is equal to or greater than the second threshold value (in case of 'Y'), step 1813 may be performed, and if not, step 1613 may be performed.

At step 1813, the error correction decoder may determine whether the unreliability value of the variable node is changed from the initial value. If the unreliability value of the variable node is changed (in case of 'Y'), step 1815 may be performed, and if not (in case of 'N'), step 1821 may be performed.

At step 1815, the error correction decoder may change the hard decision value of the variable node to the target candidate symbol. In an embodiment, the error correction decoder may set the unreliability value of the variable node to the initial value after it changes the hard decision value of the variable node to the target candidate symbol. In an embodiment, the error correction decoder may not set the unreliability value of the variable node to the initial value after it changes the hard decision value of the variable node to the target candidate symbol. This is because, when the flipping function value is equal to or greater than the second threshold value and less than the first threshold value, the target candidate symbol is a less accurate estimate for the variable node, compared to when the flipping function value is equal to or greater than the first threshold value. Accordingly, in this case, the unreliability value of the variable node may not be set to the initial value in order to easily modify the hard decision value of the variable node later.

At step 1821, the error correction decoder may change the unreliability value of the variable node.

Meanwhile, according to an embodiment, the error correction decoder may check at step 1805 whether the flipping function value is a positive number, and may determine whether the absolute value of the flipping function value is equal to or greater than the first threshold value by comparing the absolute value of the flipping function value with the first threshold value when the flipping function value is not a positive number. For example, when the first function value is related to the largest value, among the remaining updated reliability values other than the updated reliability value of the candidate symbol that is the same as the hard decision value of the variable node, and when the second function value is related to the updated reliability value of the candidate symbol that is the same as the hard decision value of the variable node, if the flipping function value is not a positive number and the absolute value thereof is equal to or greater than the first threshold value, this may mean that the hard decision value of the variable node is a more accurate estimate. Therefore, in this case, steps 1807 to 1821 may be skipped, and the error correction decoder may not modify the hard decision value of the variable node. Here, the error correction decoder may check whether the unreliability value of the variable node is changed from the initial value, and may set the unreliability value of the variable node to the initial value if the unreliability value of the variable node is changed from the initial value.

Figure 19:
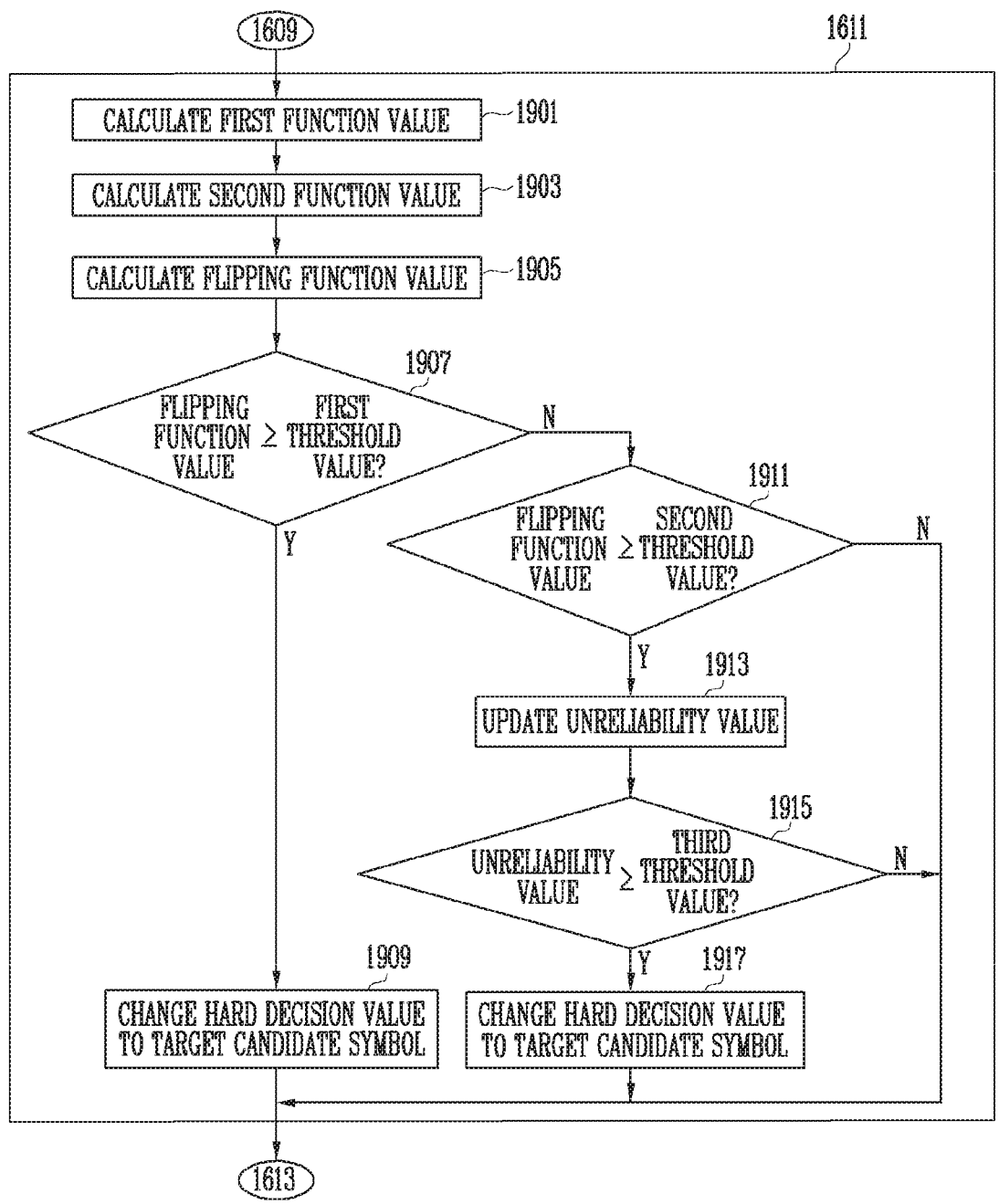

FIG. 19 is a flowchart illustrating the method of operating an error correction decoder according to an embodiment of the disclosed technology.

Steps 1901 to 1917 illustrated in FIG. 19 may be performed for each of the variable nodes.

Steps 1901 to 1917 illustrated in FIG. 19 may be performed when two or more bits are allocated in order to represent an unreliability value.

At step 1901, the error correction decoder may calculate a first function value, which is related to the updated reliability value of the target candidate symbol.

At step 1903, the error correction decoder may calculate a second function value, which is related to one or more of updated reliability values of the remaining candidate symbols other than the target candidate symbol.

At step 1905, the error correction decoder may calculate a flipping function value. The flipping function value may be a value that is calculated by subtracting the second function value from the first function value.

At step 1907, the error correction decoder may determine whether the flipping function value is equal to or greater than the first threshold value. If the flipping function value is equal to or greater than the first threshold value (in case of 'Y'), step 1909 may be performed, and if not, step 1911 may be performed.

At step 1909, the error correction decoder may change the hard decision value of the variable node to the target candidate symbol. In an embodiment, the error correction decoder may check whether the unreliability value is changed from an initial value in the variable node, and may set the unreliability value of the variable node to the initial value when the unreliability value is changed from the initial value in the variable node.

At step 1911, the error correction decoder may determine whether the flipping function value is equal to or greater than a second threshold value, which is less than the first threshold value. If the flipping function value is equal to or greater than the second threshold value (in case of 'Y'), step 1913 may be performed, and if not, step 1613 may be performed.

At step 1913, the error correction decoder may update the unreliability value of the variable node. For example, the error correction decoder may increase the unreliability value of the variable node by a preset value.

At step 1915, the error correction decoder may determine whether the updated unreliability value is equal to or greater than a third threshold value. If the updated unreliability value is equal to or greater than the third threshold value (in case of 'Y'), step 1917 may be performed, and if not (in case of 'N'), step 1613 may be performed.

At step 1917, the error correction decoder may change the hard decision value of the variable node to the target candidate symbol. In an embodiment, the error correction decoder may set the unreliability value of the variable node to the initial value after it changes the hard decision value of the variable node to the target candidate symbol. In an embodiment, the error correction decoder may not set the unreliability value of the variable node to the initial value after it changes the hard decision value of the variable node to the target candidate symbol, as described at step 1815 of FIG. 18.

Meanwhile, according to an embodiment, the error correction decoder may check at step 1905 whether the flipping function value is a positive number, and may determine whether the absolute value of the flipping function value is equal to or greater than the first threshold value by comparing the absolute value of the flipping function value with the first threshold value when the flipping function value is not a positive number. When the absolute value of the flipping function value is equal to or greater than the first threshold value, steps 1907 to 1917 may be skipped based on the same principle as that described with reference to FIG. 18, and the error correction decoder may not modify the hard decision value of the variable node. Here, the error correction decoder may check whether the unreliability value of the variable node is changed from the initial value, and may set the unreliability value of the variable node to the initial value if the unreliability value of the variable node is changed from the initial value.

Figure 20:
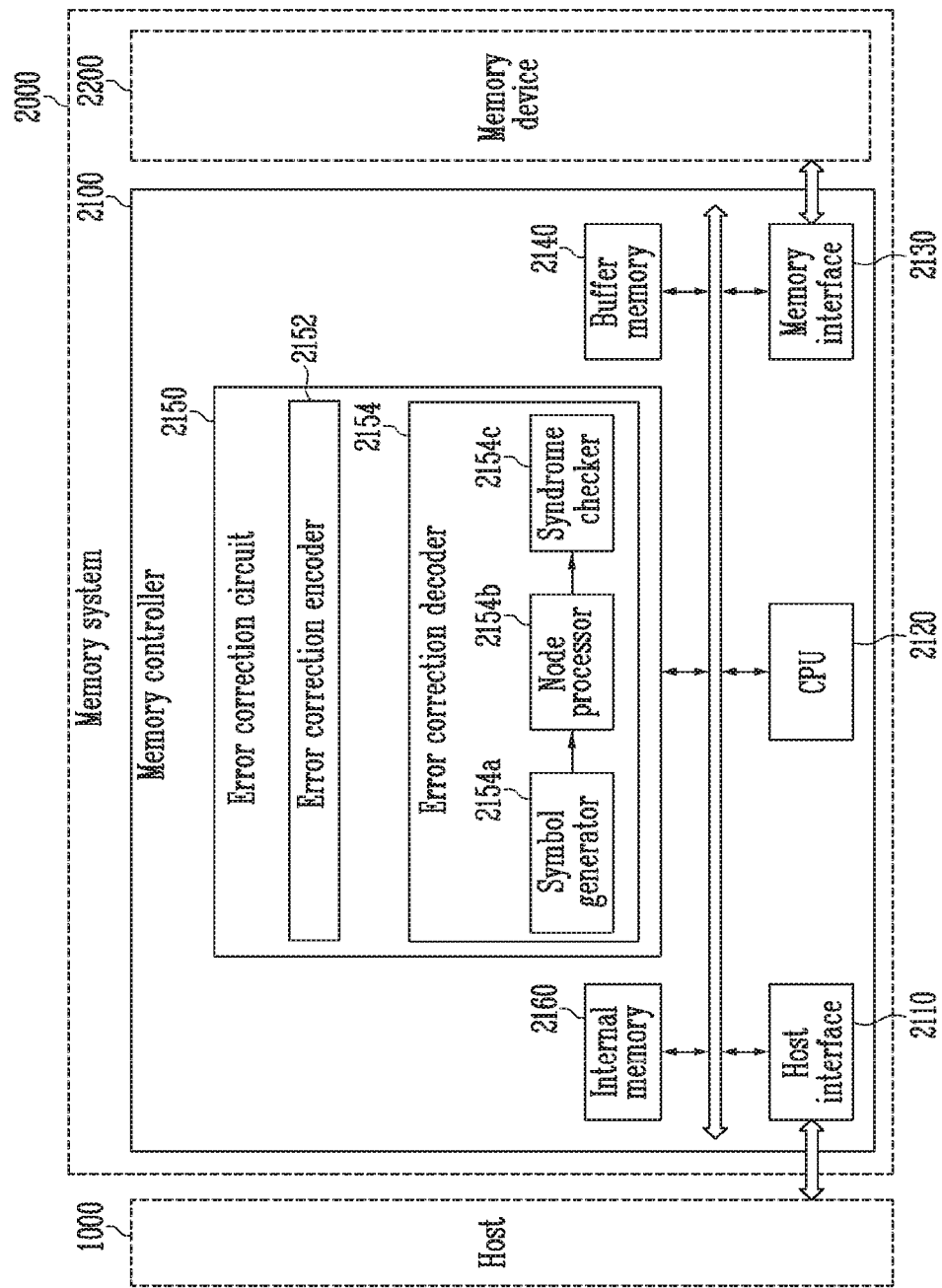
FIG. 20 is a diagram illustrating a memory system based on some implementations of the disclosed technology.

FIG. 20 is a diagram illustrating a memory system according to an embodiment of the disclosed technology.

Referring to FIG. 20, a memory system 2000 may include a memory device 2200 which stores data, and a memory controller 2100 which controls the memory device 2200 in response to a request received from a host 1000.

The host 1000 may be a device or a system which stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, but embodiments of the disclosed technology are not limited thereto.

The memory controller 2100 may control the overall operation of the memory system 2000. The memory controller 2100 may perform various operations in response to requests received from the host 1000. For example, the memory controller 2100 may perform a program operation, a read operation, an erase operation, etc. on the memory device 2200. During a program operation, the memory controller 2100 may transmit a program command, an address, a codeword, etc. to the memory device 2200. During a read operation, the memory controller 2100 may transmit a read command, an address, etc. to the memory device 2200, and may receive read data corresponding to a codeword from the memory device 2200. During an erase operation, the memory controller 2100 may transmit an erase command, an address, etc. to the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may transfer a program request, a read request, and an erase request, which are received from the host 1000, to the CPU 2120. During a program operation, the host interface 2110 may receive original data, corresponding to the program request, from the host 1000, and may store the received original data in the buffer memory 2140. During a read operation, the host interface 2110 may transmit a decoded codeword, stored in the buffer memory 2140, to the host 1000. The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the disclosed technology are not limited thereto.

The CPU 2120 may perform various types of calculations (operations) or generate commands and addresses so as to control the memory device 2200. For example, the CPU 2120 may generate various commands and addresses required for a program operation, a read operation, and an erase operation in response to requests received through the host interface 2110.

When the program request is received through the host interface 2110, the CPU 2120 may control the error correction circuit 2150 so that error correction encoding is performed on the original data stored in the buffer memory 2140. When notification that a codeword has been generated is received from the error correction circuit 2150, the CPU 2120 may generate the program command and the address, and may control the memory interface 2130 so that the generated program command and address and the codeword stored in the buffer memory 2140 are transmitted to the memory device 2200.

When the read request is received through the host interface 2110, the CPU may generate the read command and the address, and may control the memory interface 2130 so that the generated read command and address are transmitted to the memory device 2200. When notification that the read data has been received is received from the memory interface 2130, the CPU 2120 may control the error correction circuit 2150 so that error correction decoding is performed on the read data stored in the buffer memory 2140. When notification that a decoded codeword has been generated is received from the error correction circuit 2150, the CPU 2120 may control the host interface 2110 so that the decoded codeword stored in the buffer memory 2140 is transmitted to the host 1000.

The memory interface 2130 may communicate with the memory device 2200 using various interface protocols.

During a program operation, the memory interface 2130 may transmit the program command and the address, received from the CPU 2120, and the codeword, stored in the buffer memory 2140, to the memory device 2200.

During a read operation, the memory interface 2130 may transmit the read command and the address, received from the CPU 2120, to the memory device 2200. During the read operation, the memory interface 2130 may store read data, received from the memory device 2200, in the buffer memory 2140, and may notify the CPU 2120 that the read data has been received.

The buffer memory 2140 may temporarily store data while the memory controller 2100 controls the memory device 2200.

During a program operation, the buffer memory 2140 may store the original data received from the host 1000 through the host interface 2110 and transmit the stored original data to the error correction circuit 2150. During the program operation, the buffer memory 2140 may store the codeword received from the error correction circuit 2150, and may provide the stored codeword to the memory interface 2130.

During a read operation, the buffer memory 2140 may store the read data received from the memory device 2200 through the memory interface 2130 and provide the stored read data to the error correction circuit 2150. During the read operation, the buffer memory 2140 may store the decoded codeword received from the error correction circuit 2150, and may provide the stored decoded codeword to the host interface 2110.

The error correction circuit 2150 may perform error correction encoding on the original data, and may perform error correction decoding on the read data. The error correction circuit 2150 may have error correction capability at a predetermined level. For example, when a number of error bits, which do not exceed the error correction capability, are present in the read data, the error correction circuit 2150 may detect and correct the error included in the read data. The error correction encoder 2150 may be an error correction circuit which uses low-density parity check (LDPC) codes, especially, non-binary LDPC (NB-LDPC) codes, as the error correction code, but embodiments of the disclosed technology are not limited thereto.

The error correction circuit 2150 may include an error correction encoder 2152 and an error correction decoder 2154.

The error correction encoder 2152 may generate a codeword by performing error correction encoding on the original data stored in the buffer memory 2140. The error correction encoder 2152 may store the generated codeword in the buffer memory 2140, and may notify the CPU 2120 that the codeword has been generated. The basic configuration and operation of the error correction encoder 2152 may be identical to those of the error correction encoder 100, described above with reference to FIG. 1.

The error correction decoder 2154 may generate a decoded codeword by performing error correction decoding on the read data stored in the buffer memory 2140. The error correction decoder 2154 may store the decoded codeword in the buffer memory 2140, and may notify the CPU 2120 that the decoded codeword has been generated. When error included in the read data cannot be corrected, the error correction decoder 2154 may notify the CPU 2120 that error correction decoding has failed. The basic configuration and operation of the error correction decoder 2154 may be identical to those of the error correction decoder 200, described above with reference to FIG. 1. That is, a symbol generator 2154a, a node processor 2154b, and a syndrome checker 2154c, which are illustrated in FIG. 20, may perform the same operations as the symbol generator 210, the node processor 220, and the syndrome checker 230, respectively, which are illustrated in FIG. 1.

The internal memory 2160 may be used as a storage which stores various types of information required for the operation of the memory controller 2100. The internal memory 2160 may store a plurality of tables. In an embodiment, the internal memory 2160 may store an address mapping table in which logical addresses are mapped to physical addresses.

The memory device 2200 may perform a program operation, a read operation, an erase operation, etc. under the control of the memory controller 2100. The memory device 2200 may be implemented as a volatile memory device in which stored data is lost when the supply of power is interrupted or as a nonvolatile memory device in which stored data is retained even when the supply of power is interrupted.

The memory device 2200 may receive the program command, the address, and the codeword from the memory controller 2100, and may store the codeword in response to the received program command and address.

The memory device 2200 may perform a read operation on the codeword in response to the read command and the address received from the memory controller 2100, and may provide read data to the memory controller 2100.

Figure 21:
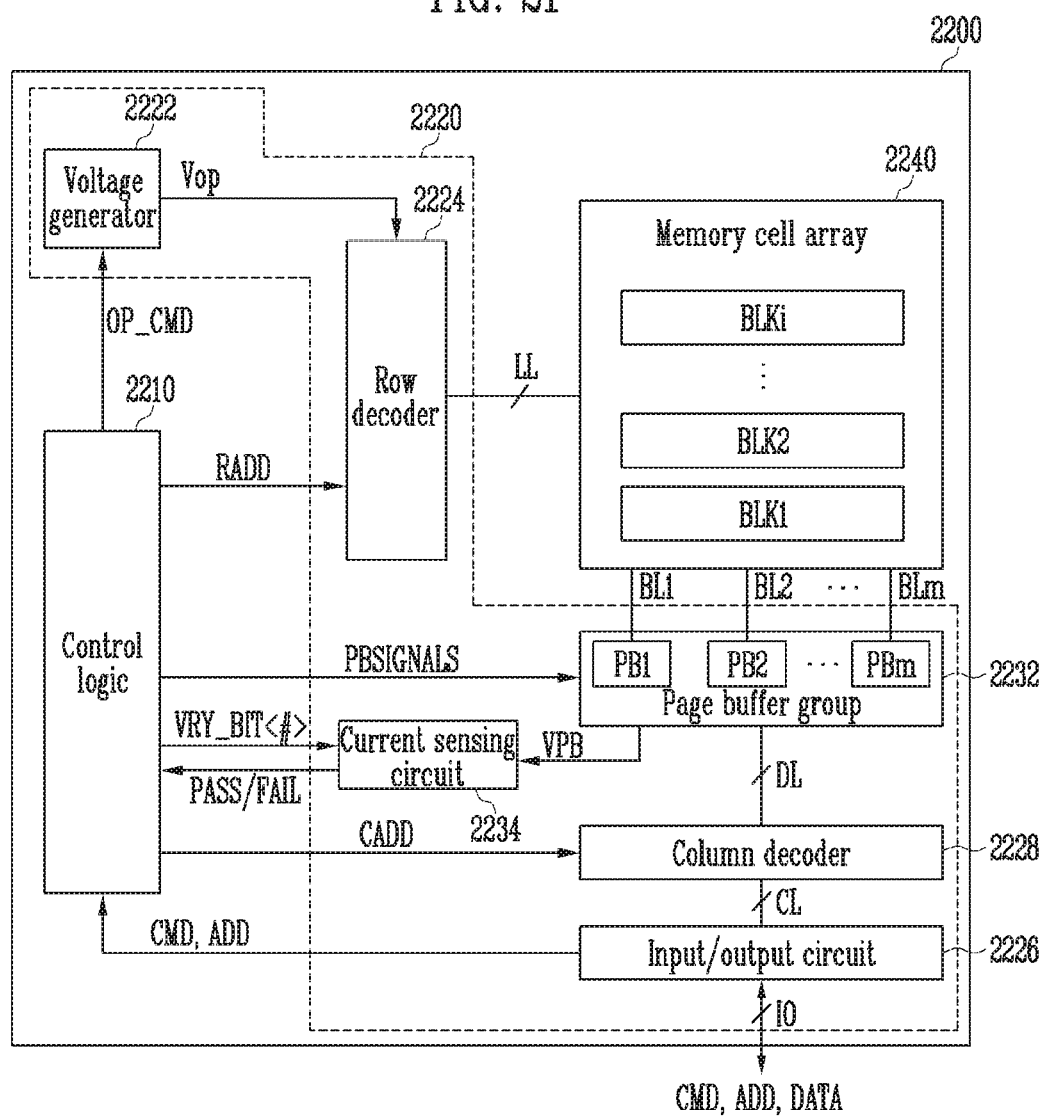
FIG. 21 is a diagram illustrating a memory device based on some implementations of the disclosed technology.

FIG. 21 is a diagram illustrating a memory device according to an embodiment of the disclosed technology. The memory device illustrated in FIG. 21 may be applied to the memory system illustrated in FIG. 20.

The memory device 2200 may include a control logic 2210, peripheral circuits 2220 and a memory cell array 2240. The peripheral circuits 2220 may include a voltage generator 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 20.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generator 2222 may generate various operating voltages Vop that are used for the program, read, and erase operations in response to the operation signal OP_CMD received from the control logic 2210. For example, the voltage generator 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (TO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 22:
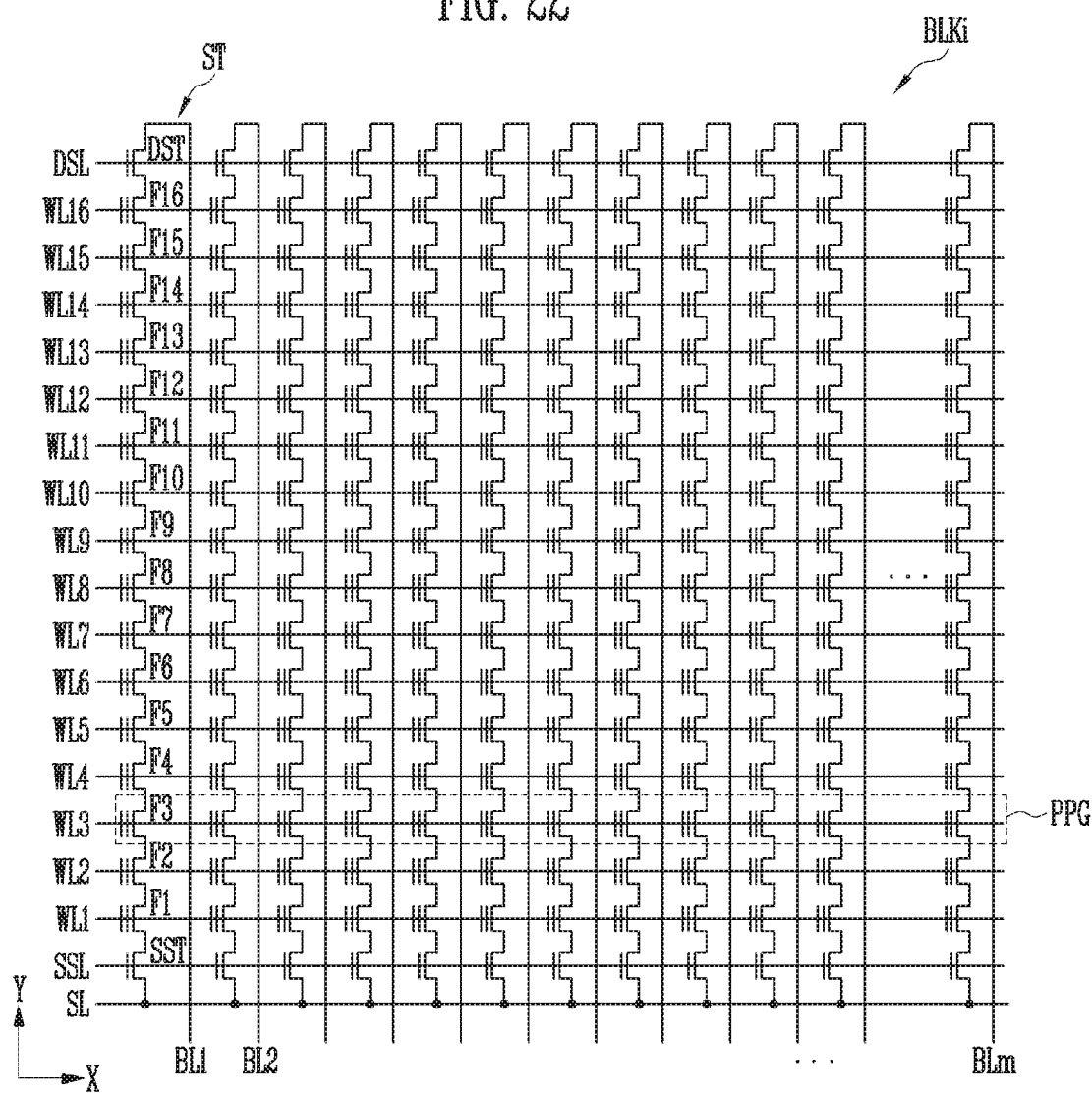
FIG. 22 is an example diagram illustrating a memory block.

FIG. 22 is an example diagram illustrating a memory block.

A memory cell array may include a plurality of memory blocks, and any one memory block BLKi of the plurality of memory blocks is illustrated in FIG. 22 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG The data corresponding to one logical page LPG may include a number of data bits identical to the number of cells included in one physical page PPG For example, when two or more bits of data are stored in one memory cell, one physical page PPG may store data corresponding to two or more logical pages LPG For example, in a memory device driven in an MLC type, data corresponding to two logical pages may be stored in one physical page PPG In a memory device driven in a TLC type, data corresponding to three logical pages may be stored in one physical page PPG FIG. 23 is a diagram illustrating an embodiment of a memory system including the memory controller of FIG. 20.

Figure 23:
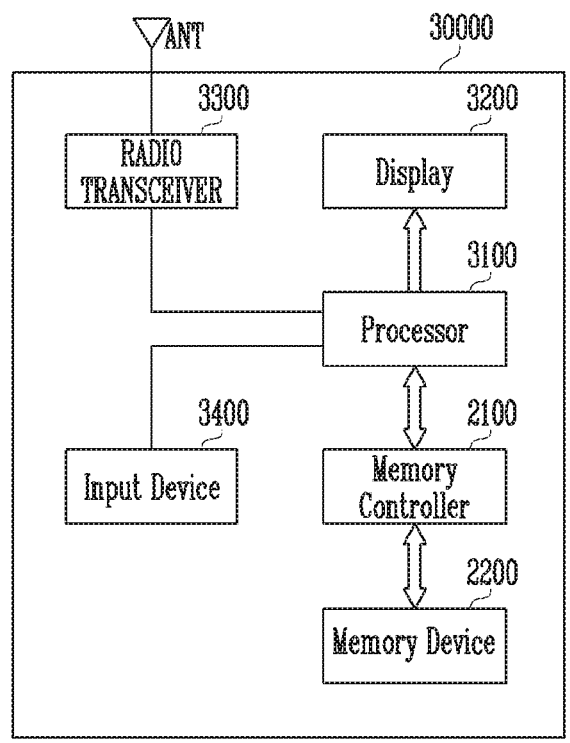
FIG. 23 and FIG. 24 are diagrams illustrating other embodiments of a memory system including a memory controller of in FIG. 20.

Referring to FIG. 23, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control the data access operation of the memory device 2200, e.g., a program operation, an erase operation or a read operation, under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 24:
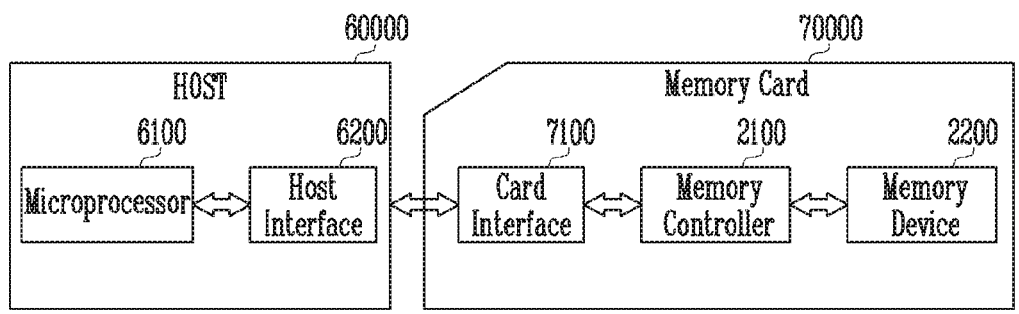

FIG. 24 is a diagram illustrating an embodiment of a memory system including the memory controller of FIG. 20.

Referring to FIG. 24, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, a console video game hardware or a digital set-top box, the host interface 6200 may perform data communication with the memory device 2200 through the card interface 7100 and the memory controller 2100 under the control of a microprocessor 6100.

In accordance with the disclosed technology, the error correction capabilities of an error correction decoder using NB-LDPC codes and a memory system having the error correction decoder can be improved.

What is claimed is:

1. An error correction decoder, comprising:
   a symbol generator configured to form an initial symbol and assign the initial symbol to a variable node;
   a reliability value manager configured to set reliability values of candidate symbols corresponding to the variable node based on the initial symbol at the time of a start of a current iteration and update the reliability values of the candidate symbols based on check-to-variable (C2V) messages received by the variable node in the current iteration;
   a flipping function value calculator configured to calculate a flipping function value by subtracting a second function value from a first function value in the current iteration, the first function value being related to an updated reliability value of a target candidate symbol, and the second function value being related to one or more of updated reliability values of remaining candidate symbols other than the target candidate symbol; and
   a symbol corrector configured to compare the flipping function value with a first threshold value in the current iteration and change a hard decision value of the variable node to the target candidate symbol upon a determination that the flipping function value is equal to or greater than the first threshold value.

2. The error correction decoder according to claim 1, wherein the flipping function value calculator is configured to select the target candidate symbol among the candidate symbols, the target candidate symbol having the largest updated reliability value among updated reliability values of the candidate symbols.

3. The error correction decoder according to claim 2, wherein:
   the first function value is the largest value among the updated reliability values of the candidate symbols or the largest value to which at least one of a scaling factor or a scaling offset is applied, and
   the second function value is a second largest value among the updated reliability values of the candidate symbols or a value obtained by adding the updated reliability values of at least two of the remaining candidate symbols.

4. The error correction decoder according to claim 2, wherein:
   the first function value is the largest value among the updated reliability values of the candidate symbols or the largest value to which at least one of a scaling factor or a scaling offset is applied, and
   the second function value is an updated reliability value of a candidate symbol that is identical to the hard decision value of the variable node.

5. The error correction decoder according to claim 1, wherein the flipping function value calculator is configured to select the target candidate symbol among the candidate symbols, the target candidate symbol having the largest updated reliability value among remaining updated reliability values other than an updated reliability value of a candidate symbol that is identical to the hard decision value of the variable node.

6. The error correction decoder according to claim 5, wherein the flipping function value calculator is configured to select the target candidate symbol based on a comparison among updated reliability values of remaining candidate symbols other than the candidate symbol that is identical to the hard decision value of the variable node.

7. The error correction decoder according to claim 5, wherein:
   the first function value is the largest value among the remaining updated reliability values or the largest value to which at least one of a scaling factor or a scaling offset is applied, and
   the second function value is the updated reliability value of the candidate symbol that is identical to the hard decision value of the variable node.

8. The error correction decoder according to claim 7, wherein the symbol corrector is configured to skip the comparison of the flipping function value with the first threshold value upon a determination that the flipping function value is not a positive number.

9. The error correction decoder according to claim 1, wherein the reliability value manager is configured to set the reliability values of the candidate symbols to be different from one another, the candidate symbols having different hamming distances from one another.

10. The error correction decoder according to claim 1, wherein the reliability value manager is configured to set the reliability values of the candidate symbols based on an iteration number of the current iteration.

11. The error correction decoder according to claim 1, wherein the reliability value manager is configured to set the reliability values of the candidate symbols based on a number of unsatisfied check nodes (UCNs) corresponding to a previous iteration performed before the current iteration.

12. The error correction decoder according to claim 1, further comprising:
a threshold value manager configured to set the first threshold value based on at least one of a degree of the variable node, a number of the iteration, or a number of unsatisfied check nodes (UCNs) corresponding to a previous iteration performed before the current iteration.

13. The error correction decoder according to claim 1, wherein the symbol corrector is configured to:
check whether an unreliability value of the variable node is changed from an initial value upon a determination that the flipping function value is equal to or greater than a second threshold value and less than the first threshold value, the second threshold value being less than the first threshold value,
update the unreliability value upon a determination that the unreliability value is not changed from the initial value as a result of checking, and
change the hard decision value of the variable node to the target candidate symbol upon a determination that the unreliability value is changed from the initial value as the result of checking.

14. The error correction decoder according to claim 13, wherein the symbol corrector is configured to change the hard decision value of the variable node to the target candidate symbol and maintain the changed unreliability value upon a determination that the flipping function value is equal to or greater than the second threshold value and less than the first threshold value and the unreliability value is changed from the initial value.

15. The error correction decoder according to claim 13, wherein the symbol corrector is configured to change the hard decision value of the variable node to the target candidate symbol and set the unreliability value to the initial value upon a determination that the flipping function value is equal to or greater than the first threshold value in a subsequent iteration proceeding after the current iteration.

16. The error correction decoder according to claim 13, wherein the symbol corrector is configured to maintain the hard decision value of the variable node and set the unreliability value to the initial value upon a determination that the flipping function value is a negative number and an absolute value of the flipping function value is equal to or greater than the first threshold value in a subsequent iteration proceeding after the current iteration.

17. The error correction decoder according to claim 1, wherein the symbol corrector is configured to:
increase an unreliability value of the variable node by a preset value upon a determination that the flipping function value is equal to or greater than a second threshold value and less than the first threshold value, the second threshold value being less than the first threshold value, and
change the hard decision value of the variable node to the target candidate symbol upon a determination that the increased unreliability value is equal to or greater than a third threshold value.

18. The error correction decoder according to claim 1, wherein the symbol corrector is configured to:
increase an unreliability value of the variable node by a first preset value upon a determination that the flipping function value is equal to or greater than a second threshold value and less than the first threshold value, the second threshold value being less than the first threshold value,
increase the unreliability value by a second preset value, which is less than the first preset value, upon a determination that the flipping function value is equal to or greater than a third threshold value and less than the second threshold value, the third threshold value being less than the second threshold value, and
change the hard decision value of the variable node to the target candidate symbol upon a determination that the increased unreliability value is equal to or greater than a fourth threshold value.

19. A memory system, comprising:
a memory device; and
a memory controller in communication with the memory device and including an error correction decoder configured to perform an error correction decoding using non-binary low-density parity check (NB-LDPC) codes based on a read vector received from the memory device,
wherein the error correction decoder comprises:
a symbol generator configured to form an initial symbol by grouping read values included in the read vector and assign the initial symbol to a variable node;
a reliability value manager configured to set reliability values of candidate symbols corresponding to the variable node based on the initial symbol at the time of a start of a current iteration and update the reliability values of the candidate symbols based on check-to-variable (C2V) messages received by the variable node in the current iteration;
a flipping function value calculator configured to calculate a flipping function value by subtracting a second function value from a first function value in the current iteration, the first function value being related to an updated reliability value of a target candidate symbol, and the second function value being related to one or more of updated reliability values of remaining candidate symbols other than the target candidate symbol; and
a symbol corrector configured to compare the flipping function value with a first threshold value in the current iteration and change a hard decision value of the variable node to the target candidate symbol upon a determination that the flipping function value is equal to or greater than the first threshold value.

20. The memory system according to claim 19, wherein the flipping function value calculator is configured to select the target candidate symbol among candidate symbols, the target candidate symbol having the largest updated reliability value among the updated reliability values of the candidate symbols or among remaining updated reliability values other than an updated reliability value of a candidate symbol that is identical to the hard decision value of the variable node.

* * * * *